(12) United States Patent
Wang et al.

(10) Patent No.: US 12,140,871 B2
(45) Date of Patent: Nov. 12, 2024

(54) GRAY TONE UNIFORMITY CONTROL OVER SUBSTRATE TOPOGRAPHY

(71) Applicant: Applied Materials, Inc., Santa Clara, CA (US)

(72) Inventors: YingChiao Wang, Tainan (TW); Chi-Ming Tsai, San Jose, CA (US); Chun-chih Chuang, Changhua (TW); Yung Peng Hu, Maioli County (TW)

(73) Assignee: Applied Materials, Inc., Santa Clara, CA (US)

( * ) Notice: Subject to any disclaimer, the term of this patent is extended or adjusted under 35 U.S.C. 154(b) by 103 days.

(21) Appl. No.: 18/048,748

(22) Filed: Oct. 21, 2022

(65) Prior Publication Data

US 2024/0134287 A1 Apr. 25, 2024
US 2024/0231239 A9 Jul. 11, 2024

(51) Int. Cl.
*G03F 7/00* (2006.01)
*G02B 26/08* (2006.01)

(52) U.S. Cl.
CPC ..... *G03F 7/70191* (2013.01); *G02B 26/0833* (2013.01)

(58) Field of Classification Search
CPC .......................... G03F 7/70191; G02B 26/0833
See application file for complete search history.

(56) References Cited

U.S. PATENT DOCUMENTS

| 10,571,809 | B1 | 2/2020 | Bencher et al. |
| 2009/0155728 | A1 | 6/2009 | Locascio et al. |
| 2013/0130182 | A1 | 5/2013 | Markle et al. |
| 2020/0333711 | A1* | 10/2020 | Chen ..................... G03F 7/7065 |
| 2022/0005844 | A1 | 1/2022 | Yong |
| 2022/0326616 | A1* | 10/2022 | Bencher ................ G03F 7/2057 |
| 2022/0333711 | A1 | 10/2022 | Zuo et al. |
| 2023/0408807 | A1* | 12/2023 | Laidig ................ G02B 26/0833 |

OTHER PUBLICATIONS

PCT Notification of Transmittal of the International Search Report and the Written Opinion of the International Searching Authority for International Application No. PCT/US2023/077080; dated Feb. 8, 2024.

\* cited by examiner

*Primary Examiner* — Deoram Persaud
(74) *Attorney, Agent, or Firm* — Patterson + Sheridan, LLP

(57) ABSTRACT

Embodiments of the present disclosure generally relate to lithography systems. More particularly, embodiments of the present disclosure relate to a method, a system, and a software application for a lithography process to control transmittance rate of write beams and write gray tone patterns in a single exposure operation. In one embodiment, a plurality of shots are provided by an image projection system in a lithography system to a photoresist layer. The plurality of shots exposes the photoresist layer to an intensity of light emitted from the image projection system. The local transmittance rate of the plurality of shots within an exposure area is varied to form varying step heights in the exposure area of the photoresist layer.

20 Claims, 17 Drawing Sheets

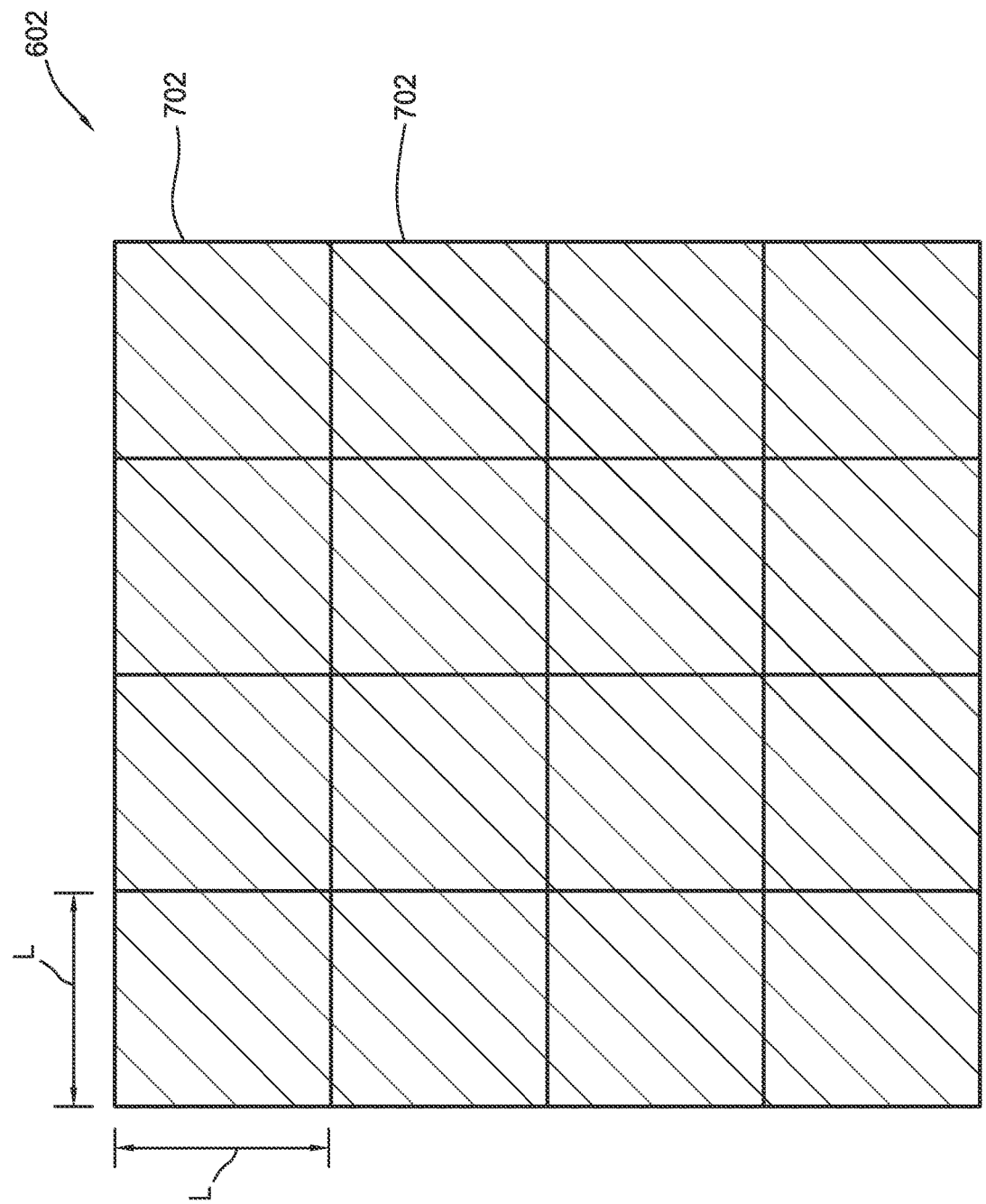

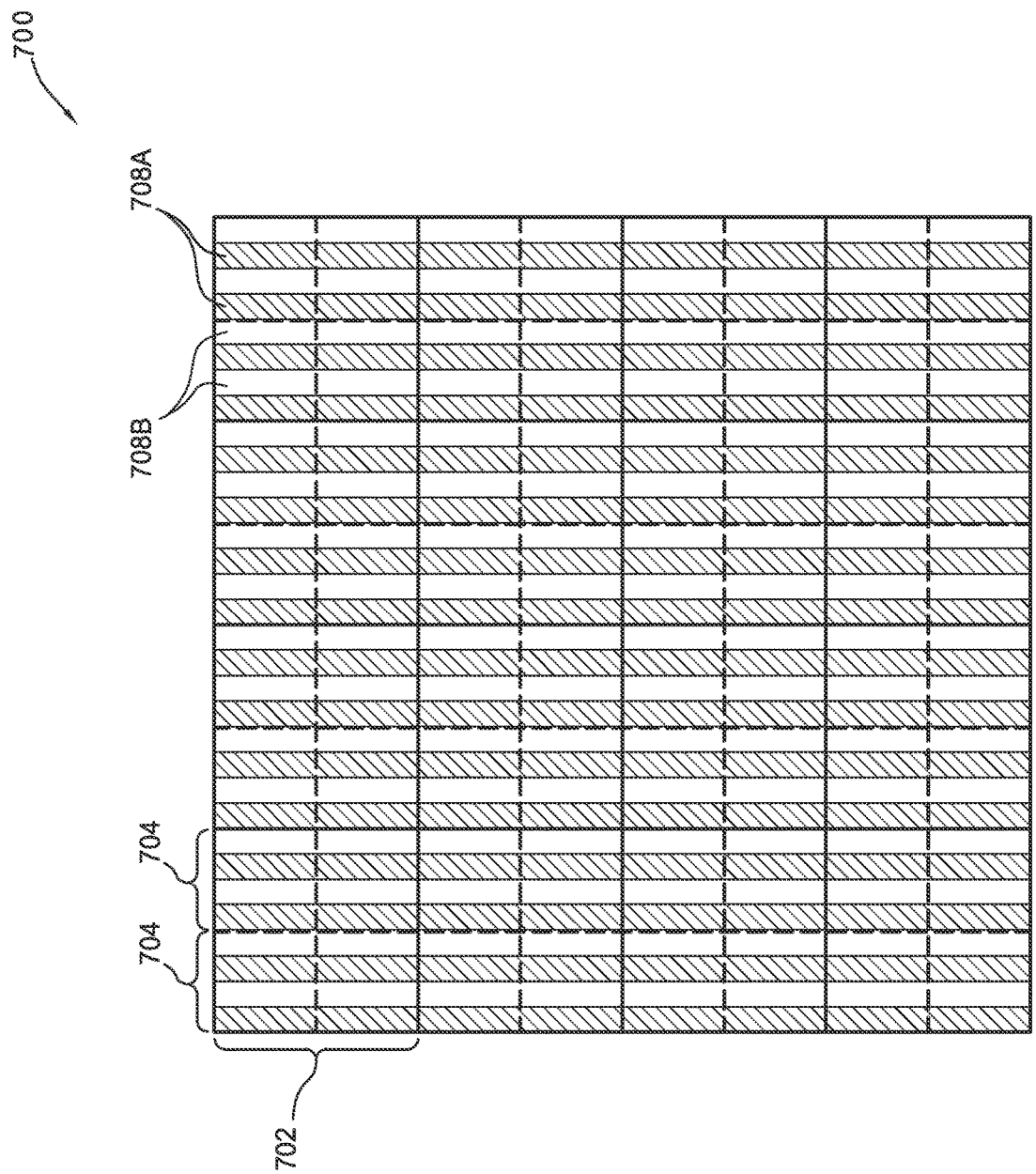

GRAY TONE UNIFORMITY CONTROL OVER SUBSTRATE TOPOGRAPHY

BACKGROUND

Field

Embodiments of the present disclosure generally relate to lithography systems. More particularly, embodiments of the present disclosure relate to a system, a software application, and a method of a lithography process to control transmittance rate of write beams to write gray tone patterns in a single exposure operation.

Description of the Related Art

Photolithography is widely used in the manufacturing of semiconductor devices, such as for back-end processing of semiconductor devices, and display devices, such as liquid crystal displays (LCDs). For example, large area substrates are often utilized in the manufacture of LCDs. LCDs, or flat panel displays, are commonly used for active matrix displays, such as computers, touch panel devices, personal digital assistants (PDAs), cell phones, television monitors, and the like. Generally, flat panel displays include a layer of liquid crystal material as a phase change material at each pixel, sandwiched between two plates. When power from a power supply is applied across or through the liquid crystal material, an amount of light passing through the liquid crystal material is controlled, i.e., selectively modulated, at the pixel locations enabling images to be generated on the display.

A conventional digital lithography system utilizes a plurality of image projection systems. Each image projection system is configured to project a plurality of write beams into a photoresist layer on a surface of the substrate. A pattern, also known as a mask pattern, is written into the photoresist layer on the surface of the substrate by the write beams projected by the projection lens system.

With a conventional lithography system, to write a pattern of a plurality of gray tone portions into a photoresist disposed over a substrate, multiple passes of the substrate under the writable area of the lithography system are required. Multiple passes of the substrate under the writable area of a digital lithography system decreases throughput.

Accordingly, what is needed in the art is a system, a software application, and a method of a lithography process with an improved ability to write gray tone patterns in a single exposure operation with a single exposure.

SUMMARY

In one embodiment, a method for a lithography process is provided. The method includes providing a mask pattern data having a plurality of exposure areas to a processing unit of a lithography system. The processing unit includes a plurality of image projection systems that receive the mask pattern data, wherein each exposure area includes a gray pattern. The gray pattern includes a plurality of sub-grids and a plurality of pattern units in each sub-grid. Each of the plurality of pattern units are include a plurality of patterned lines. The plurality of patterned lines in the plurality of pattern units of each sub-grid correspond to a local transmittance rate of a plurality of shots to be received in each sub-grid. In a single scan of a substrate having a photoresist layer disposed thereon under the plurality of image projection systems, the method further includes projecting a plurality of shots to the plurality of patterned lines in each of the plurality of pattern units of the gray pattern to the photoresist layer, and developing the photoresist layer to form a desired profile in the photoresist layer, the desired profile defined by the local transmittance rate at each sub-grid of each exposure area.

In another embodiment, a layered film device is provided. The layered film device includes a substrate and a patterned photoresist layer having a predetermined profile disposed on the substrate. The patterned photoresist is formed from a photoresist layer in a single exposure operation by a lithography system. The predetermined profile of the patterned photoresist may be formed by providing a mask pattern data having a plurality of exposure areas to a processing unit of the lithography system. The processing unit of the lithography system has an image projection system that receives the mask pattern data, and the mask pattern data corresponds to the predetermined profile of the patterned photoresist. Each of the plurality of exposure areas in the mask pattern data includes a gray pattern having a plurality of sub-grids with each sub-grid having a plurality of pattern units. Each of the plurality of pattern units includes a plurality of patterned lines. The plurality of patterned lines in each of the plurality of sub-grids corresponds to a local transmittance rate of a plurality of shots to each sub-grid. The predetermined profile of the patterned photoresist may be formed by next projecting the plurality of shots at a designated dose to the plurality of patterned lines in each of the plurality of pattern units of the gray pattern, and then developing the photoresist layer to form the predetermined profile in the photoresist layer. The predetermined profile defined by the local transmittance rate of the plurality of shots at the designated dose received in each sub-grid of each exposure area.

In another embodiment, a system for a lithography process is provided. The system includes a slab and a moveable stage disposable over the slab. The moveable stage configured to support a substrate having a photoresist layer disposed thereon. The system also includes a controller configured to provide mask pattern data to a lithography system. The mask pattern data includes an exposure area with a gray pattern and the gray pattern is defined by a plurality of sub-grids. Each of the sub-grids include a plurality of pattern units defined therein. The system further includes a lithography system support coupled to the slab having an opening to allow the moveable stage to pass thereunder. The lithography system has a processing unit with a plurality of image projection systems that receive the mask pattern data and each image projection system comprising a spatial light modulator with a plurality of spatial light modulator pixels to project a plurality of shots. The controller is configured to dispose a plurality of patterned lines in each of the plurality of pattern units within each of the sub-grids to vary a local transmittance rate at each sub-grid, and the controller is configured to instruct each of the spatial light modulators to project the plurality of shots to the plurality of patterned lines in each of the plurality of pattern units in each sub-grid of the gray pattern.

In yet another embodiment, a non-transitory computer-readable medium for a lithography process is provided. The non-transitory computer-readable medium stores instructions that, when executed by a processor, cause a computer system to perform the operations of providing a mask pattern data having a plurality of exposure areas to a processing unit of a lithography system. The processing unit includes a plurality of image projection systems that receive the mask pattern data and each exposure area includes a gray pattern. The gray pattern includes a plurality of sub-grids and a plurality of pattern units in each sub-grid. Each of the plurality of pattern units includes a plurality of patterned lines. The plurality of patterned lines in each sub-grid correspond to a local transmittance rate of each sub-grid. in a single scan of a substrate having a photoresist layer disposed thereon under the plurality of image projection systems, the operations further include projecting a plurality of shots to the plurality of patterned lines of the gray pattern to the photoresist layer, and developing the photoresist layer to form a desired profile in the photoresist layer, the desired profile defined by the local transmittance rate at each sub-grid of each exposure area.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIG. 7A is a schematic, plan view of an exposure area divided into a plurality of sub-grids, according to certain embodiments.

FIG. 7B is a schematic, plan view of a gray pattern with a plurality of sub-grids, according to certain embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure relate to a system, a software application, and a method of a lithography process to control the transmittance rate of write beams delivered to a substrate to write gray tone patterns in a single exposure operation. One embodiment of the system includes a controller configured to provide mask pattern data to a lithography system. The mask pattern data includes a gray pattern. The lithography system has a processing unit with a plurality of image projection systems that receive the mask pattern data. Each image projection system includes a spatial light modulator with a plurality of spatial light modulator pixels to project a multiplicity of shots. The controller is configured to vary the local beam shots across the substrate.

Figure 1:
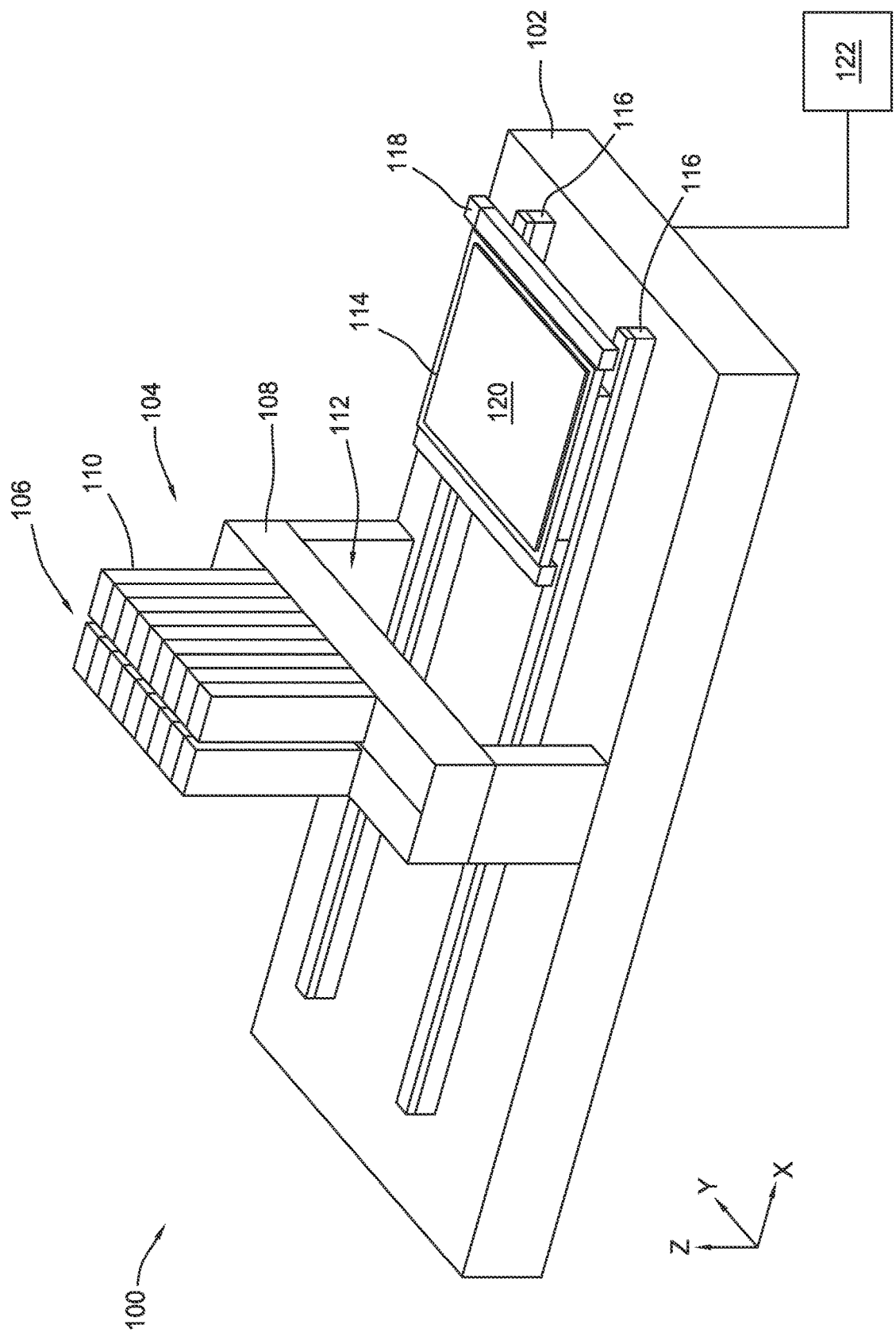
FIG. 1 is a perspective view of a system, according to certain embodiments.

FIG. 1 is a perspective view of a system 100, such as a digital lithography system, that may benefit from embodiments described herein. The system 100 includes a stage 114 and a processing apparatus 104. The stage 114 is supported by a pair of tracks 116 disposed on a slab 102. A substrate 120 is supported by the stage 114. The stage 114 is supported by a pair of tracks 116 disposed on the slab 102. The stage 114 moves along the pair of tracks 116 in the X direction as indicated by the coordinate system shown in FIG. 1. In one embodiment, which can be combined with other embodiments described herein, the pair of tracks 116 is a pair of parallel magnetic channels. As shown, each track of the pair of tracks 116 extends in a straight line path. An encoder 118 is coupled to the stage 114 in order to provide information of the location of the stage 114 to a controller 122.

The controller 122 is generally designed to facilitate the control and automation of the processing techniques described herein. The controller 122 may be coupled to or in communication with the processing apparatus 104, the stage 114, and the encoder 118. The processing apparatus 104 and the encoder 118 may provide information to the controller 122 regarding the substrate processing and the substrate aligning. For example, the processing apparatus 104 may provide information to the controller 122 to alert the controller 122 that substrate processing has been completed. The controller 122 facilitates the control and automation of methods of a lithography process that includes varying the local beam transmittance during a single exposure. A program (or computer instructions), which may be referred to as an imaging program, readable by the controller 122, determines which tasks are performable on a substrate 120. The program includes a mask pattern data and code to monitor and control the processing time and substrate position. The mask pattern data corresponds to a pattern to be written into the photoresist using the electromagnetic radiation.

The substrate 120 comprises any suitable material, for example, glass, which is used as part of a flat panel display. In other embodiments, which can be combined with other embodiments described herein, the substrate 120 is made of other materials capable of being used as a part of the flat panel display. The substrate 120 has a film layer to be patterned formed thereon, such as by pattern etching thereof, and a photoresist layer formed on the film layer to be patterned, which is sensitive to electromagnetic radiation, for example ultra-violet (UV) or deep UV "light". A positive photoresist includes portions of the photoresist, when exposed to radiation, are respectively soluble to a photoresist developer applied to the photoresist after the pattern is written into the photoresist using the electromagnetic radiation. A negative photoresist includes portions of the photoresist, when exposed to radiation, will be respectively insoluble to photoresist developer applied to the photoresist after the pattern is written into the photoresist using the electromagnetic radiation. The chemical composition of the photoresist determines whether the photoresist is a positive photoresist or negative photoresist. Examples of photoresists include, but are not limited to, at least one of diazonaphthoquinone, a phenol formaldehyde resin, poly(methyl methacrylate), poly(methyl glutarimide), and SU-8. After exposure of the photoresist to the electromagnetic radiation, the resist is developed to leave a patterned photoresist on the underlying film layer. Then, using the patterned photoresist, the underlying thin film is transfer etched to form a similar pattern in the underlying film layer. The underlying film layer is utilized to form a portion of the electronic circuitry of the display panel.

The processing apparatus 104 includes a support 108 and a processing unit 106. The processing apparatus 104 straddles the pair of tracks 116 and is disposed on the slab 102, and thereby includes an opening 112 for the pair of tracks 116 and the stage 114 to pass under the processing unit 106. The processing unit 106 is supported over the slab 102 by a support 108. In one embodiment, which can be combined with other embodiments described herein, the processing unit 106 is a pattern generator configured to expose a photoresist in a photolithography process. In some embodiments, which can be combined with other embodiments described herein, the pattern generator is configured to perform a maskless lithography process. The processing unit 106 includes a plurality of image projection systems. One example of an image projection system is show in FIG. 2A. In one embodiment, which can be combined with other embodiments described herein, the processing unit 106 contains as many as 84 image projection systems. Each image projection system is disposed in a case 110. The processing unit 106 is useful to perform maskless direct pattern writing to a photoresist or other electromagnetic radiation sensitive materials.

Figure 2B:
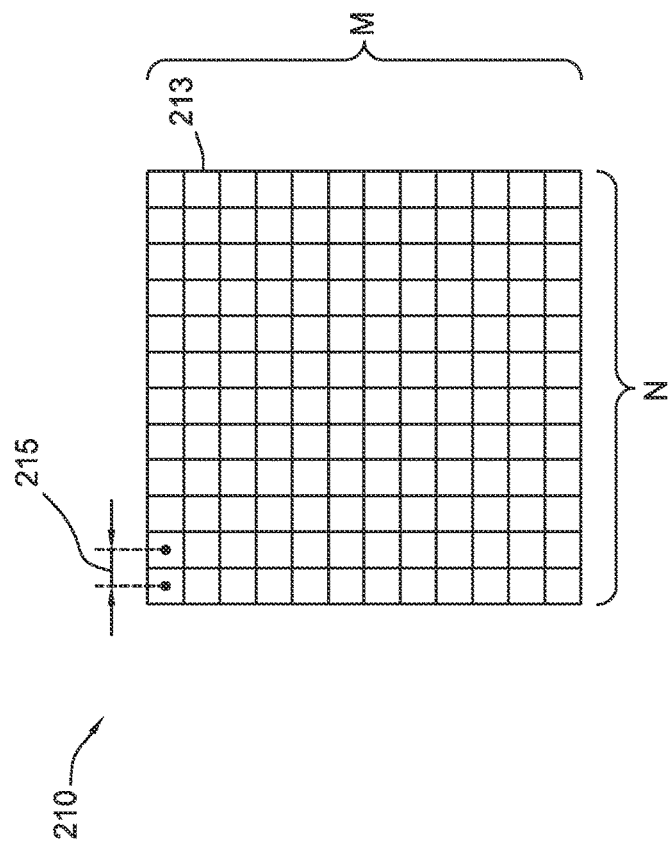
FIG. 2B is a schematic view of a spatial light modulator, according to certain embodiments.
Figure 2A:
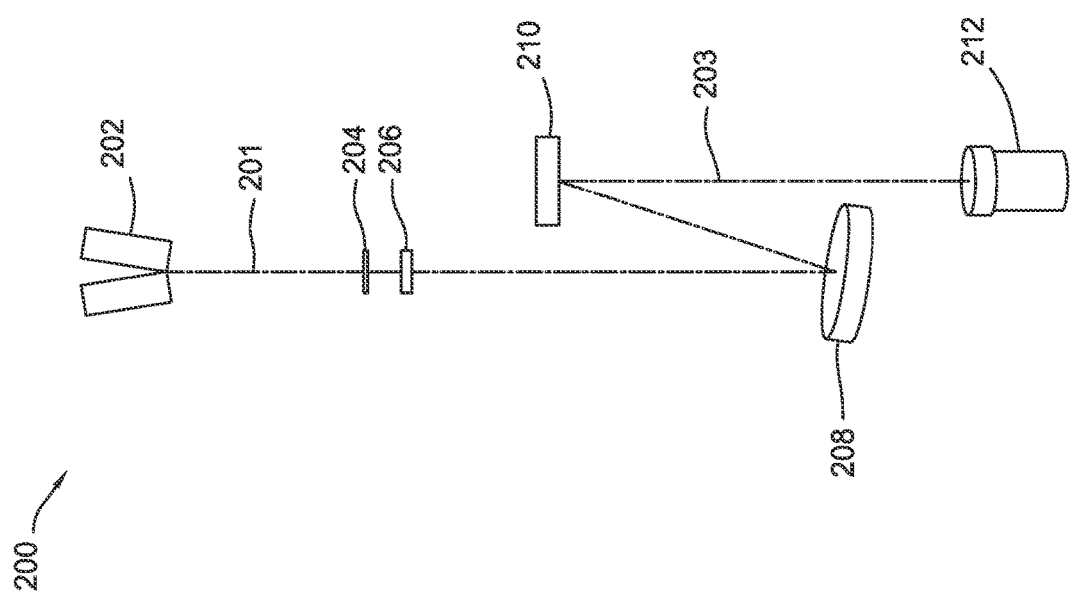
FIG. 2A is a schematic, cross-sectional view of an image projection system, according to certain embodiments.

FIG. 2A is a schematic, cross-sectional view of an image projection system 200 that may be used in system 100. The image projection system 200 includes a spatial light modulator 210 and projection optics 212. The components of the image projection system 200 vary depending on the spatial light modulator 210 being used. The spatial light modulator 210 includes an array of electrically addressable elements. The electrically addressable elements include, but are not limited to, digital micromirrors, liquid crystal displays (LCDs), liquid crystal over silicon (LCoS) devices, ferroelectric liquid crystal on silicon (FLCoS) devices, and microshutters. The spatial light modulator 210 includes a plurality of spatial light modulator pixels. Each spatial light modulator pixel of the plurality of spatial light modulator pixels are individually controllable and are configured to project a write beam corresponding to a pixel of a plurality of pixels. The compilation of plurality of pixels form the pattern written into the photoresist, referred to herein as the mask pattern. The projection optics 212 includes projection lenses, for example 10× objective lenses, used to project the light onto the substrate 120. In operation, based on the mask pattern data provided to the spatial light modulator 210 by the controller 122, each spatial light modular pixel of the plurality of spatial light modulator pixels is at an "on" position or "off" position. Each spatial light modular pixel at an "on" position forms a write beam that the projection optics 212 then projects the write beam to the photoresist layer surface of the substrate 120 to form a pixel of the mask pattern. As used herein, a write beam is also referred to as a "shot."

In one embodiment, which can be combined with other embodiments described herein, the spatial light modulator 210 is a DMD. The image projection system 200 includes a light source 202, an aperture 204, a lens 206, a frustrated prism assembly 208, the DMD, and the projection optics 212. The DMD includes a plurality of mirrors, i.e, the plurality of spatial light modulator pixels. Each mirror of the plurality of mirrors corresponds to a pixel that may correspond to a pixel of the mask pattern. In some embodiments, which can be combined with other embodiments described herein, the DMD includes 2560×1600 mirrors. In some examples, the DMD includes more than about 4,000,000 mirrors. The light source 202 is any suitable light source, such as a light emitting diode (LED) or a laser, capable of producing a light having a predetermined wavelength. In one embodiment, which can be combined with other embodiments described herein, the predetermined wavelength is in the blue or near ultraviolet (UV) range, such as less than about 450 nm. The frustrated prism assembly 208 includes a plurality of reflective surfaces. In operation, a light beam 201 is produced by the light source 202. The light beam 201 is reflected to the DMD by the frustrated prism assembly 208. When the light beam 201 reaches the mirrors of the DMD, each mirror at an "on" position reflect the light beam 201, i.e., forms a write beam, also known as a "shot", that the projection optics 212 then projects as a shot to the photoresist layer surface of the substrate 120. The plurality of write beams 203, also known as a plurality of shots, forms a plurality of pixels of the mask pattern.

FIG. 2B is a schematic view of the spatial light modulator 210 that is a DMD. The plurality of mirrors 213, also known as the plurality of spatial light modulator pixels, are arranged in a grid having M rows and N columns. Each of the plurality of mirrors 213 is operable to be in an "on" position or an "off" position. A pixel pitch 215 is defined as the distance between the centroid of adjacent spatial light modulator pixels.

Figure 6:
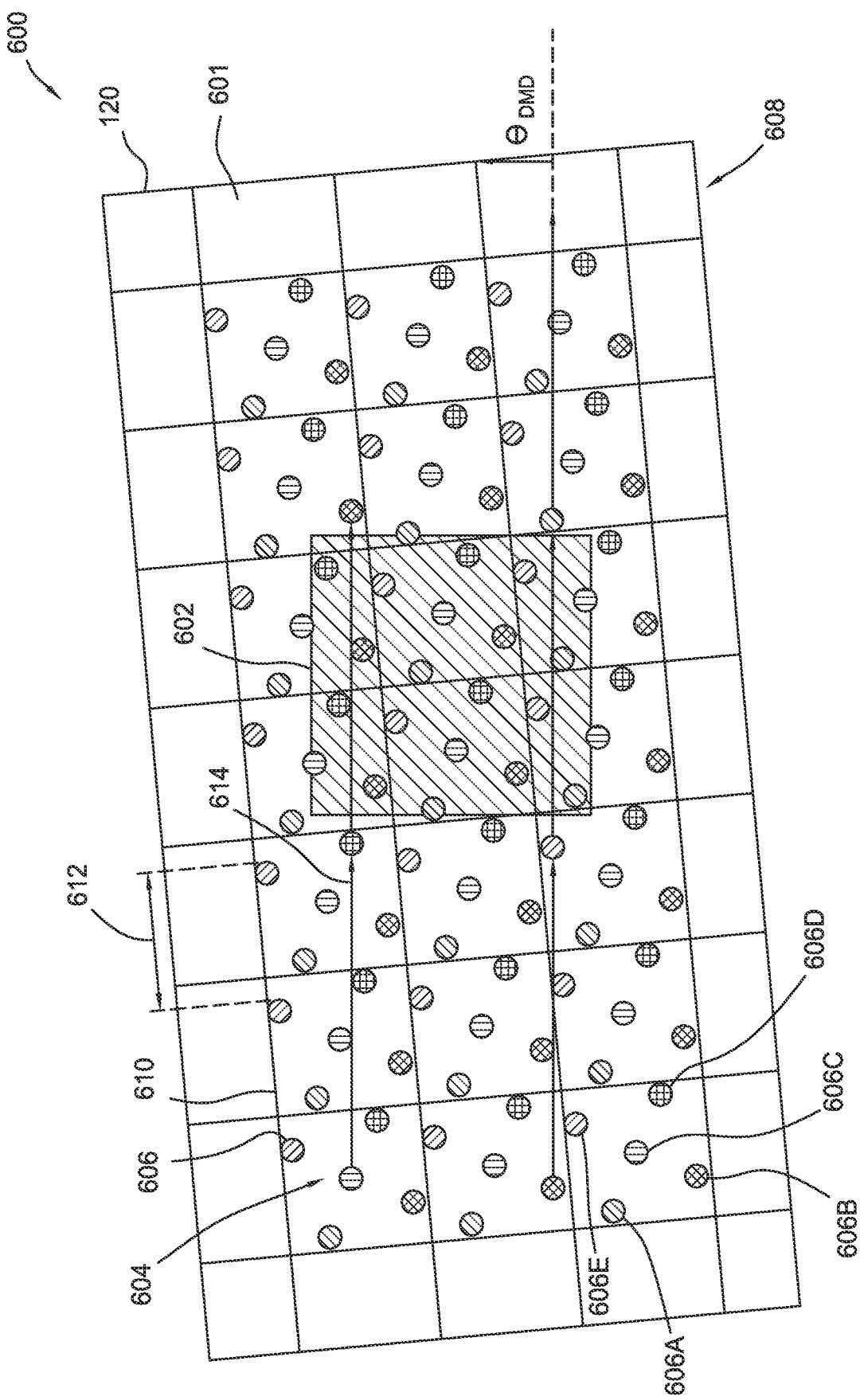
FIG. 6 is a schematic, plan view of a portion of a substrate during a digital lithography process, according to certain embodiments.

The plurality of spatial light modulator pixels of the spatial light modulator 210 are configured in an aggregated shot pattern 604 (shown in FIG. 6) where each spatial light modulator pixel corresponds to a potential shot 606 (shown in FIG. 6). Each potential shot 606 represents the centroid of a mirror 213. The controller 122 (shown in FIG. 1) provides instructions to the spatial light modulator 210 based on the mask pattern data. The mask pattern data determines which of the plurality of mirrors 213 are in the "on" position. In embodiments when a mirror 213 is in the "on" position, a shot is delivered. In embodiments when a mirror 213 is in the "off" position, a shot is not delivered.

Figure 3:
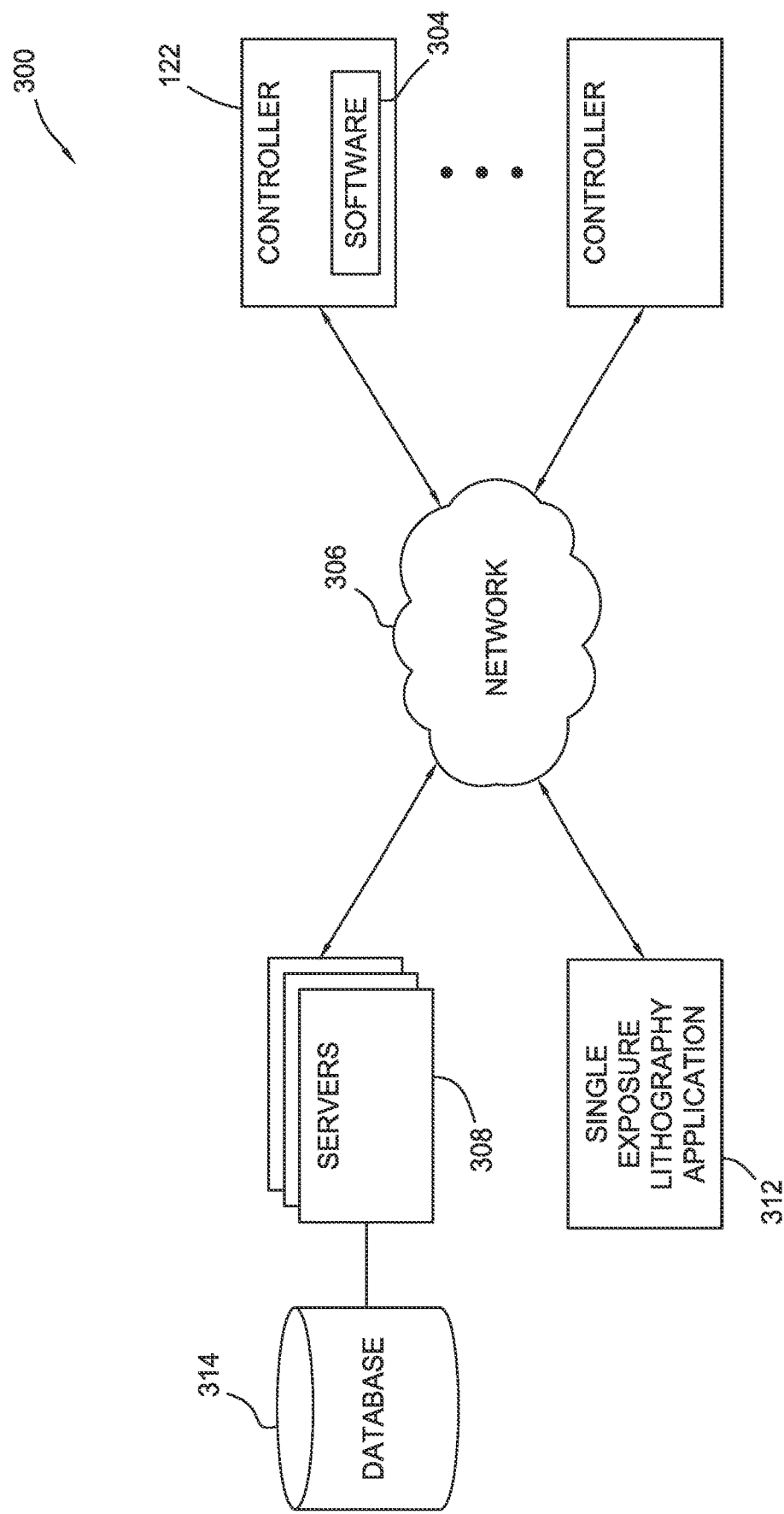
FIG. 3 is a schematic view of a computing system, according to certain embodiments.

FIG. 3 is a schematic view of a computing system 300 configured for varying a local beam transmittance across a substrate in which embodiments of the disclosure may be practiced. As shown in FIG. 3, the computing system 300 may include a plurality of servers 308, a single exposure lithography application 312, and a plurality of controllers 122 (i.e., computers, personal computers, mobile/wireless devices, only two of which are shown for clarity), each connected to a communications network 306 (for example, the Internet). The servers 308 may communicate with the database 314 via a local connection (for example, a Storage Area Network (SAN) or Network Attached Storage (NAS)) or over the Internet. The servers 308 are configured to either directly access data included in the database 314 or to interface with a database manager that is configured to manage data included within the database 314.

Figure 4:
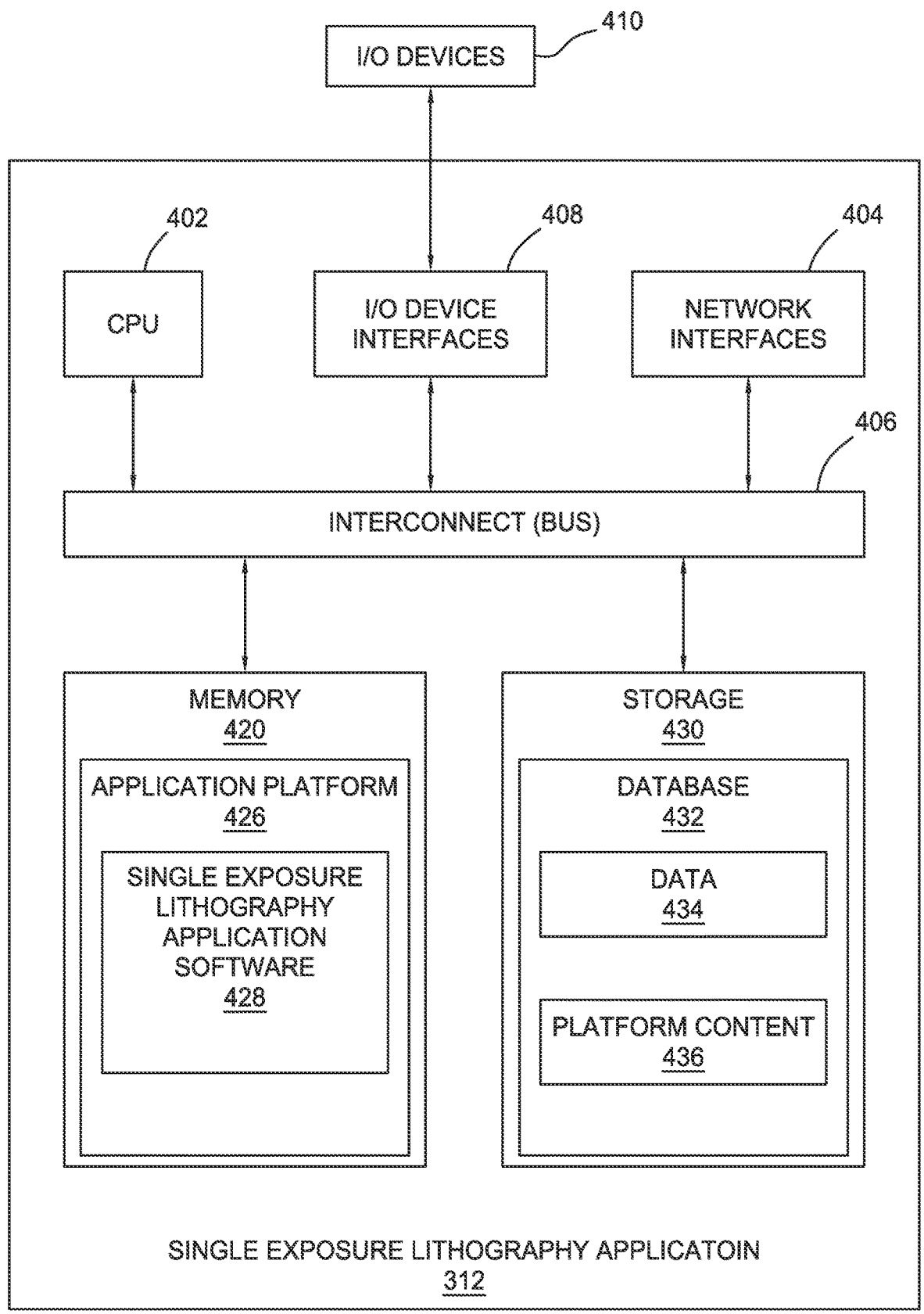
FIG. 4 is a schematic view of the single exposure lithography application, according to certain embodiments.

Each controller 122 may include components of a computing device, for example, a processor, system memory, a hard disk drive, a battery, input devices such as a mouse and a keyboard, and/or output devices such as a monitor or graphical user interface, and/or a combination input/output device such as a touchscreen which not only receives input but also displays output. Each server 308 and the single exposure lithography application 312 may include a processor and a system memory (not shown), and may be configured to manage content stored in database 314 using, for example, relational database software and/or a file system. The I/O device interfaces 408, as shown in FIG. 4, may be programmed to communicate with one another, the controllers 122, and the single exposure lithography application 312 using a network protocol such as, for example, the TCP/IP protocol. The single exposure lithography application 312 may communicate directly with the controllers 122 through the communications network 306. The controllers 122 are programmed to execute software 304, such as programs and/or other software applications, and access applications managed by servers 308.

In the embodiments described below, users may respectively operate the controllers 122 that may be connected to the servers 308 over the communications network 306. Pages, images, data, documents, and the like may be displayed to a user via the controllers 122. Information and images may be displayed through a display device and/or a graphical user interface in communication with the controller 122.

It is noted that the controller 122 may be a personal computer, laptop mobile computing device, smart phone, video game console, home digital media player, network-connected television, set top box, and/or other computing devices having components suitable for communicating with the communications network 306 and/or the required applications or software. The controller 122 may also execute other software applications configured to receive content and information from the single exposure lithography application 312.

FIG. 4 is a schematic view of the single exposure lithography application 312. The single exposure lithography application 312 includes, without limitation, a central processing unit (CPU) 402, a network interface 404, memory 420, and storage 430 communicating via an interconnect 406. The single exposure lithography application 312 may also include I/O device interfaces 408 connecting I/O devices 410 (for example, keyboard, video, mouse, audio, touchscreen, etc.). The single exposure lithography application 312 may further include the network interface 504 (shown in FIG. 5) configured to transmit data via the data communications network.

The CPU 402 retrieves and executes programming instructions stored in the memory 420 and generally controls and coordinates operations of other system components. Similarly, the CPU 402 stores and retrieves application data residing in the memory 420. The CPU 402 is included to be representative of a single CPU, multiple CPU's, a single CPU having multiple processing cores, and the like. The interconnect 406 is used to transmit programming instructions and application data between the CPU 402, I/O device interfaces 408, storage 430, network interfaces 404, and memory 420.

The memory 420 is generally included to be representative of a random access memory and, in operation, stores software applications and data for use by the CPU 402. Although shown as a single unit, the storage 430 may be a combination of fixed and/or removable storage devices, such as fixed disk drives, floppy disk drives, hard disk drives, flash memory storage drives, tape drives, removable memory cards, CD-ROM, DVD-ROM, Blu-Ray, HD-DVD, optical storage, network attached storage (NAS), cloud storage, or a storage area-network (SAN) configured to store non-volatile data.

The memory 420 may store instructions and logic for executing an application platform 426 which may include single exposure lithography application software 428. The storage 430 may include a database 432 configured to store data 434 and associated application platform content 436. The database 432 may be any type of storage device.

Network computers are another type of computer system that can be used in conjunction with the disclosures provided herein. Network computers do not usually include a hard disk or other mass storage, and the executable programs are loaded from a network connection into the memory 420 for execution by the CPU 502 (shown in FIG. 5). A typical computer system will usually include at least a processor, memory, and an interconnect coupling the memory to the processor.

Figure 5:
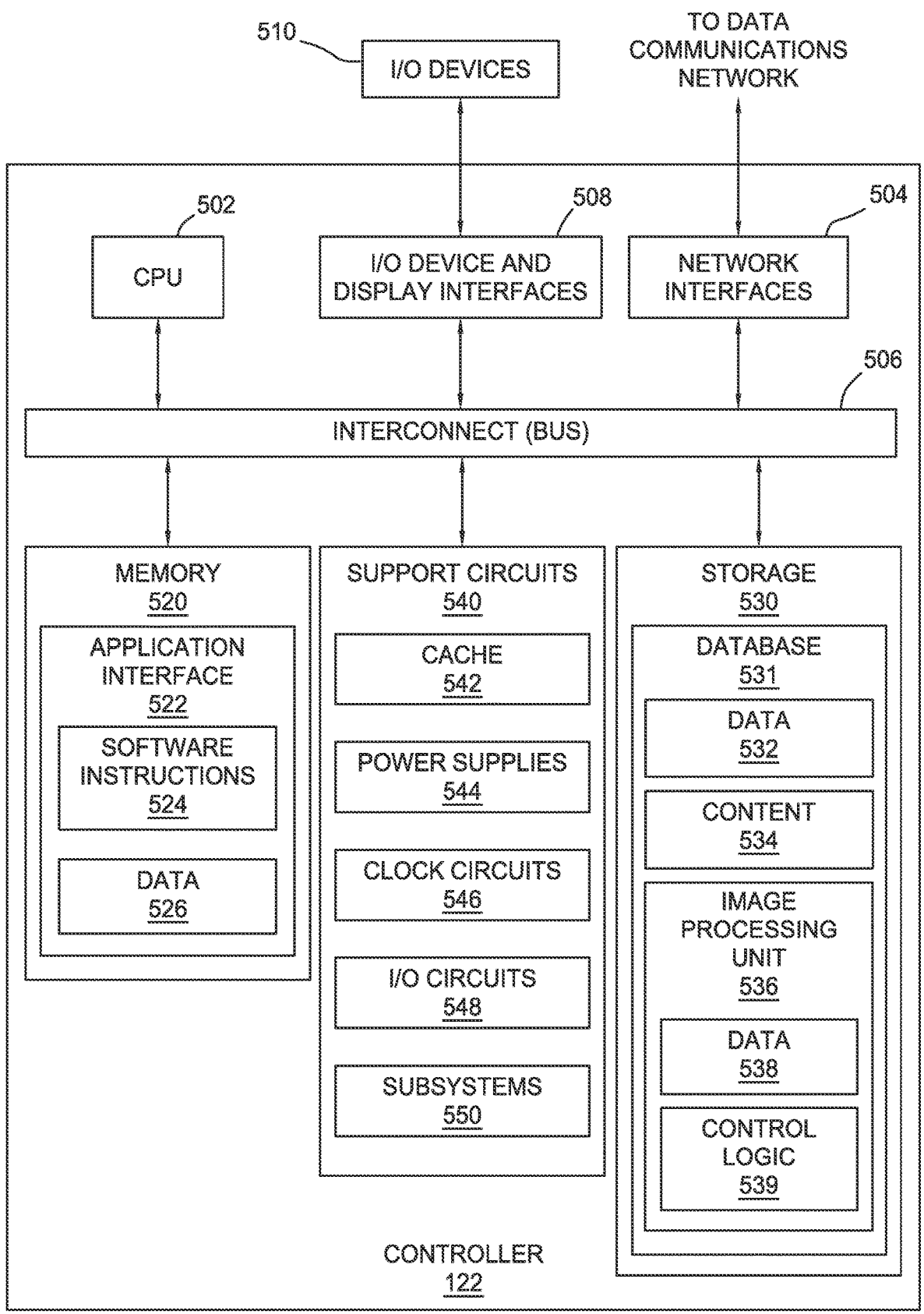
FIG. 5 is a schematic view of a controller, according to certain embodiments.

FIG. 5 is a schematic view of a controller 122 used to access the single exposure lithography application 312 and retrieve or display data associated with the application platform 426. The controller 122 may include, without limitation, a central processing unit (CPU) 502, a network interface 504, an interconnect 506, a memory 520, storage 530, and support circuits 540. The controller 122 may also include an I/O device interface 508 connecting I/O devices 510 (for example, keyboard, display, touchscreen, and mouse devices) to the controller 122.

Like CPU 402, CPU 502 is included to be representative of a single CPU, multiple CPU's, a single CPU having multiple processing cores, etc., and the memory 520 is generally included to be representative of a random access memory. The interconnect 506 may be used to transmit programming instructions and application data between the CPU 502, I/O device interfaces 508, storage 530, network interface 504, and memory 520. The network interface 504 may be configured to transmit data via the communications network 306, for example, to transfer content from the single exposure lithography application 312. Storage 430, such as a hard disk drive or solid-state storage drive (SSD), may store non-volatile data. The storage 530 may contain a database 531. The database 531 may contain data 532, other content 534, and an image process unit 536 having data 538 and control logic 539. Illustratively, the memory 520 may include an application interface 522, which itself may display software instructions 524, and/or store or display data 526. The application interface 522 may provide one or more software applications which allow the controller to access data and other content hosted by the single exposure lithography application 312.

As shown in FIG. 1, the system 100 includes the controller 122. The controller 122 includes a central processing unit (CPU) 502, memory 520, and support circuits 540 (or I/O 508). The CPU 502 may be one of any form of computer processors that are used in industrial settings for controlling various processes and hardware (e.g., pattern generators, motors, and other hardware) and monitor the processes (e.g., processing time and substrate position). The memory 520, as shown in FIG. 5, is connected to the CPU 502, and may be one or more of a readily available memory, such as random access memory (RAM), read only memory (ROM), floppy disk, hard disk, or any other form of digital storage, local or remote. Software instructions and data can be coded and stored within the memory for instructing the CPU 502. The support circuits 540 are also connected to the CPU 502 for supporting the processor in a conventional manner. The support circuits 540 may include conventional cache 542, power supplies 544, clock circuits 546, input/output circuitry 548, subsystems 550, and the like. A program (or computer instructions) readable by the controller 122 determines which tasks are performable on a substrate 120. The program may be software readable by the controller 122 and may include code to monitor and control, for example, the processing time and substrate position.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The algorithms and displays presented herein are not inherently related to any particular computer or other apparatus. Various general purpose systems may be used with programs in accordance with the teachings herein, or it may prove convenient to construct a more specialized apparatus to perform the required method operations. The structure for a variety of these systems will appear from the description above. In addition, the present examples are not described with reference to any particular programming language, and various examples may thus be implemented using a variety of programming languages.

As described in greater detail within, embodiments of the disclosure relate to a lithography application relating to the ability to apply mask pattern data to a substrate 120 in a single exposure lithography process. The embodiments described herein relate to a software application platform. The software application platform includes methods of forming three-dimensional profiles in a single exposure.

FIG. 6 is a schematic, plan view of a portion 600 of the substrate 120 during a digital lithography process. The substrate 120 includes a photoresist layer 601 disposed over the substrate 120. In some embodiments, which can be combined with other embodiments described herein, an underlying film layer is disposed under the photoresist layer. An image projection system 200 (shown in FIG. 2) corresponding to the portion 600 of the substrate 120 receives the mask pattern data from the controller 122. The mask pattern data defines one or more exposure areas 602 overlaid on the substrate 120. The exposure areas 602 define an area of the photoresist layer 601 to be exposed to write beams from the image projection system 200. The exposure area 602 includes, but is not limited to, a square, circular, triangular, elliptical, regular polygonal, irregular polygonal, and/or irregular shape. One or more exposure areas 602 may be provided in the mask pattern data.

The plurality of spatial light modulator pixels of the spatial light modulator 210 are configured in an aggregated shot pattern 604. The aggregated shot pattern 604 is overlaid on the substrate 120. Each spatial light modulator pixel of the spatial light modulator 210 corresponds to a potential shot 606. The aggregated shot pattern 604 depicts the locations where each of the potential shots 606 could be projected on the substrate 120. The mask pattern data determines which of the plurality of spatial light modulator pixels is in an "off" position or an "on" position. Each potential shot 606 represents the centroid of a mirror 213 (shown in FIG. 2B). When the spatial light modulator pixel is in the "on" position, the potential shot 606 is projected to the corresponding location on the substrate 120.

As shown in FIG. 6, a grid 608 of a plurality of unit areas 610 is overlaid on the substrate 120. Each unit area 610 corresponds to one spatial light modulator pixel of the spatial light modulator 210. In the embodiment shown in FIG. 6, each unit area 610 is operable to receive five distinct potential shots 606 (i.e., a first shot 606A, a second shot 606B, a third shot 606C, a fourth shot 606D, and a fifth shot 606E) depending on the mask pattern data. Each unit area 610 may include hundreds of shots 606, such as between about 50 and about 500 potential shots. For example, in an embodiment, each unit area 610 includes between 70 and 350 potential shots 606. Increasing the number of potential shots 606 will allow for finer control of light concentration on the photoresist layer 601. Each of the first shot 606A, the second shot 606B, the third shot 606C, the fourth shot 606D, and the fifth shot 606E across the plurality of spatial light modulator pixels are projected sequentially.

The aggregated shot pattern 604 has an aggregated shot pitch 612. The aggregated shot pitch 612 is the distance between adjacent potential shots 606. The aggregated shot pitch 612 is determined by the pixel pitch 215 (shown in FIG. 2B) and the magnification of the image projection system 200. Each plurality of potential shots 606 has a shot step 614 between each potential shot 606. The plurality of potential shots 606 are uniformly distributed within each unit area 610 to minimize the distance between each of the potential shots 606. The spatial light modulator 210 is slightly rotated against the shot step 614 direction by $\theta_{DMR}$. The image projection system 200 can be installed on the support 108 such that the spatial light modulators 210 are rotated by $\theta_{DMR}$.

When the substrate 120 scans under the image projection system 200, the processing unit 106 projects the plurality of shots 606 corresponding to the plurality of spatial light modulator pixels in the "on" position to the portion 600 of the substrate 120. Each shot 606 of the plurality of shots 606 is projected inside the exposure area 602, as defined according to the mask pattern data. The plurality of shots 606 in the exposure area 602 may partially overlap. For example, when the plurality of shots 606 are sufficiently dense within the exposure area 602, a pattern corresponding to the exposure area 602 is exposed in the photoresist layer 601.

FIG. 7A is a schematic, plan view of an exposure area 602 divided into a plurality of sub-grids 702. Each sub-grid 702 has a length L. A gray pattern 700 is provided in the mask pattern data by the controller 122. The gray pattern 700 defines the transmittance rate of the write beams to be delivered to the exposure area 602. The gray pattern 700 is determined according to the method 1000 described herein. In some embodiments, which can be combined with other embodiments described herein, the area of the sub-grid 702 is less than the area of the plurality of mirrors 213 (shown in FIG. 2B). In certain embodiments, the length L may be larger than the optical resolution of the image projection system 200 and larger than the pixel pitch 215. Alternatively, the length L may be less than the optical resolution of the image projection system 200 and the optical resolution is less than the pixel pitch 215. Additionally, the length L may be reduced to achieve a desired profile with greater step height variations. Reducing the length L will provide for steeper slopes in the topography of the profile to be formed by the corresponding increase in the number of sub-grids 702 in the exposure area 602.

FIG. 7B is a schematic, plan view of the gray pattern 700 with a plurality of sub-grids 702. The sub-grids 702 are utilized to designate the transmittance rate of the write beam on certain portions of the exposure area 602. As the plurality of shots 606 (shown in FIG. 6) corresponding to the plurality of spatial light modulator pixels in the "on" positon are provided to the exposure area 602, the gray pattern 700 may be utilized to vary the shots received within each sub-grid 702, thereby designating the local transmittance rate to be delivered to each sub-grid 702.

A plurality of pattern units 704 are defined within each sub-grid 702 by the mask pattern data. The plurality of pattern units 704 are used to designate the local transmittance rate in each sub-grid 702. The plurality of pattern units 704 are designed with a plurality of parallel spaced apart patterned lines 708A used to achieve the local transmittance rate. The plurality of parallel patterned lines 708A, 708B designate portions of the sub-grid 702 that receive and do not receive "shots" from the image projection system 200. The local transmittance rate therefore corresponds to the area of the pattern units 704 designated to receive "shots." For example, in order to reduce the local transmittance rate in a specific sub-grid 702 by 50%, the patterned lines 708 within each of the plurality of pattern units 704 are formed with an area that is 50% of the respective pattern unit 704 that in turn translates to covering 50% of the respective sub-grid 702 the respective pattern units 704 make up. In such an example, only "shots" which fall into the patterned lines 708A of the plurality of pattern units 704, and hence, in each sub-grid 702, will be provided in order to achieve the desired transmittance rate during processing. The ratio of the area of the patterned lines 708 to the area of each of the pattern units 704 defines a gray pattern transmittance map. The gray pattern transmittance map is utilized to define a shape and size of the plurality of pattern units 704.

FIGS. 8A-8D is a schematic, plan view of a plurality of pattern units 704, according to certain embodiments. FIGS. 8A-8D show examples of the pattern units 704 in each sub-grid 702. The plurality of pattern units 704 are not limited to those shown in FIGS. 8A-8D. In certain embodiment, each of the pattern units 704 are designed with alternating patterned lines 708A and non-patterned lines 708B. In certain embodiments, the alternating patterned and non-patterned lines 708A, 708B in each of the pattern units 704 may be vertical or disposed at a rotation angle within the pattern unit 704. The design of the pattern units 704 are determined based on complexity of the exposure area 602 and imperfections from the image projection system 200. The plurality of pattern units 704 in each sub-grid 702 may achieve a local transmittance rate of between 0% and 100% in each sub-grid 702.

Figure 8A:
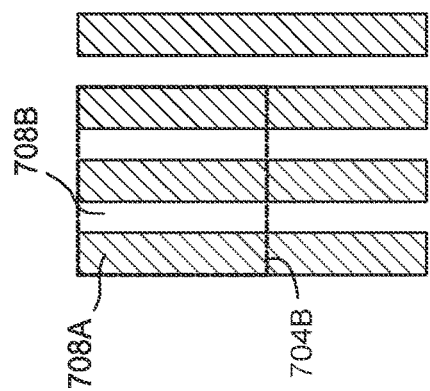
FIGS. 8A-8D is a schematic, plan view of a plurality of pattern units, according to certain embodiments.
Figure 8B:
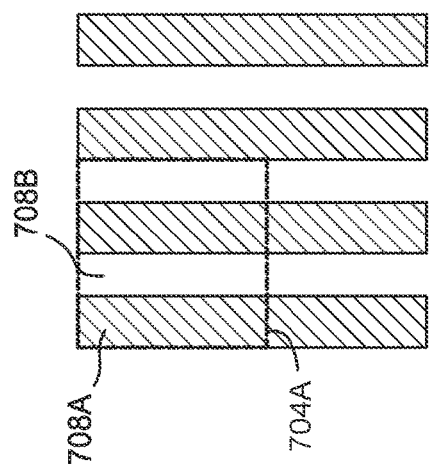

FIG. 8A shows an embodiment of pattern unit 704A formed with 2-pitch vertical patterned lines 708A. In such an embodiment, each pattern unit 704A includes two (2) patterned lines 708A alternating with two (2) non-patterned lines 708B. FIG. 8B shows an embodiment of pattern unit 704B formed with 2.5-pitch vertical patterned lines 708A. In such an embodiment, each pattern unit 704B includes 3 patterned lines 708A alternating with 2 non-patterned lines 708B.

Figure 8C:
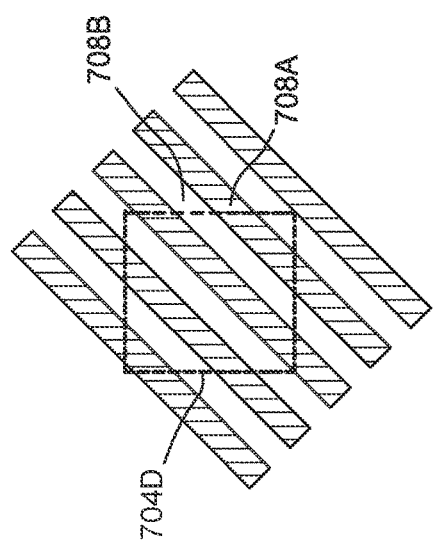
Figure 8D:
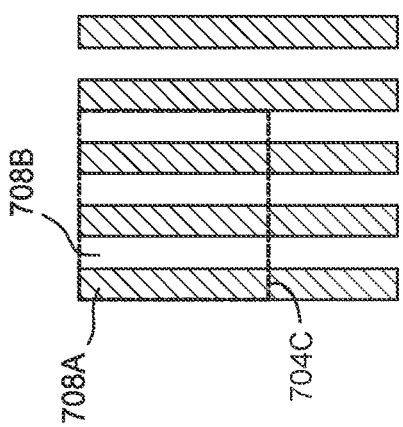

In another embodiment, FIG. 8C depicts pattern unit 704C formed with 3-pitch vertical patterned lines 708A. In such an embodiment, each pattern unit 704C includes 3 patterned lines 708A alternating with 3 non-patterned lines 708B. In yet another embodiment, FIG. 8D depicts pattern unit 704D formed with 3-pitch angled patterned lines 708A. Increases in the patterned line pitch count of the pattern units 704 allows for greater and finer control over the transmittance rate delivered to the pattern units 704, thereby allowing for more control over the amount of photoresist removed from the photoresist layer 601 and the resulting topography thereon. However, increasing the pitch of the pattern units 704 correspondingly also increases the complexity of the data thereby reducing the efficiency and throughput of the system. As such, when designing the of the pattern unit 704, consideration should be given to the complexity of the exposure area and need for pattern units 704 with higher pitch counts.

Delivery of the potential shots 606 (shown in FIG. 6) in each sub-grid 702 and corresponding to the plurality of spatial light modulator pixels overlapping with the patterned lines 708 of the gray pattern 700 in the "on" position, is instructed by the controller 122 according to the mask pattern data. In one embodiment, which can be combined with other embodiments described herein, the plurality of pattern units 704 corresponds with the plurality of unit areas 610 in which the plurality of shots 606 are uniformly distributed in. The local transmittance rate in the sub-grid 702 is therefore determined by the ratio of the area of the plurality of pattern lines 708 to the area of the respective pattern units 704 in the sub-grids 702 of the gray pattern 700.

Figure 9B:
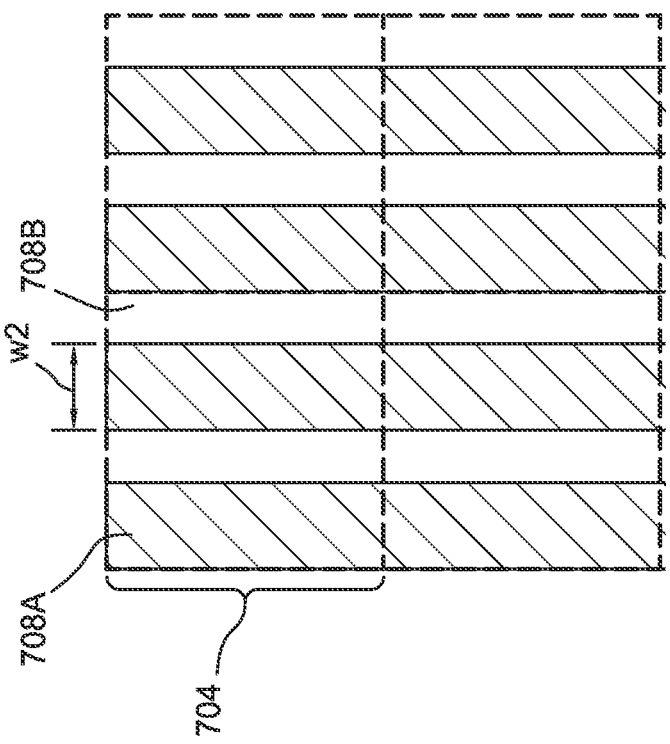
FIGS. 9A and 9B is a schematic plan view of a change in transmittance rate for a plurality of pattern units, according to certain embodiments.
Figure 9A:
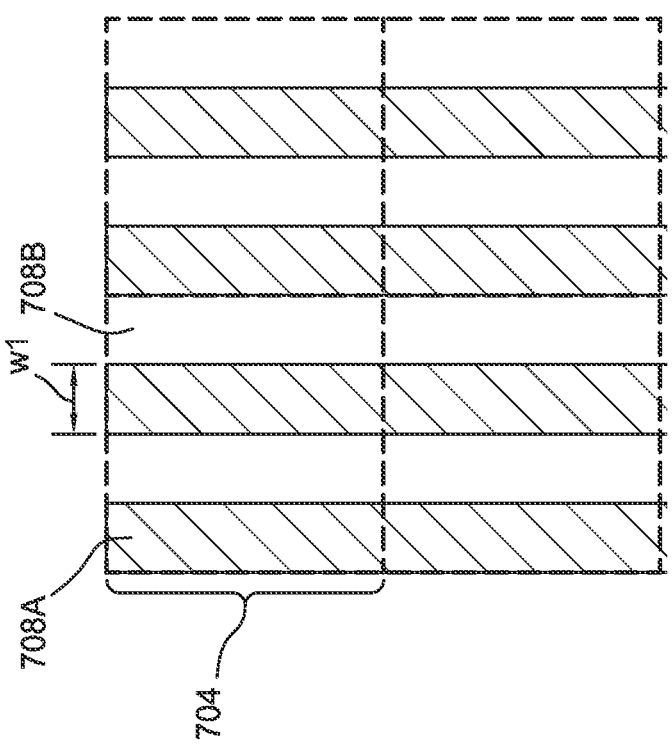

As shown in FIGS. 9A and 9B, the local transmittance rate in sub-grids 702 may therefore by adjusted by varying a width "W" of the patterned lines 708A in the plurality of pattern units 704 defined in the respective sub-grid 702. As discussed herein, since only "shots" which fall into the patterned lines 708A of the plurality of pattern units 704 will be provided in each respective sub-grid 702, the number of the plurality of shots 606 received by a pattern unit 704 and the corresponding sub-grid 702 therein, may therefore also align with the ratio of the width of the plurality of pattern lines 708 to the width of the respective pattern unit 704. In some embodiments, the number of the plurality of shots 606 and the local transmittance rate in each sub-grid 702 may not perfectly align with the ratio of an area of the plurality of pattern lines 708 to the area of the pattern unit 704 due to the discrete nature of digital lithography.

The plurality of pattern units 704 defined in a single sub-grid 702 may therefore achieve a local transmittance rate in the respective sub-grid 702. In one embodiment, which can be combined with other embodiments described herein, to vary the local transmittance rate in sub-grids 702, the width of the patterned lines 708A are increased to correspondingly increase the transmittance rate to the specific sub-grid 702. In FIG. 9A, an example of a plurality of pattern units 704 formed with 2-pitch vertical patterned lines 708 is shown with the width "W1" of the patterned lines 708A sized to cover 50% of the pattern units 704 to achieve a 50% local transmittance rate in the corresponding sub-grid 702. In FIG. 9B, the width of the patterned lines 708A in the same sub-grid 702 is increased by 25% to "W2", which correspondingly increases the local transmittance rate by 25% to 62.5%. The increased local transmittance rate translates to the sub-grid 702 shown in FIG. 9B such that the sub-grid 702 in FIG. 9B will receive more of the plurality of potential shots 606 than the sub-grid 702 shown in FIG. 9A. Conversely, decreasing the width of the patterned lines 708A correspondingly decreases the transmittance rate to the corresponding sub-grid 702.

In one embodiment, which can be combined with other embodiments described herein, each sub-grid 702 includes pattern units 704 having the same local transmittance rate. In another embodiment, which can be combined with other embodiments described herein, the local transmittance rate of pattern units 704 is different in at least two adjacent sub-grids 702.

Figure 10:
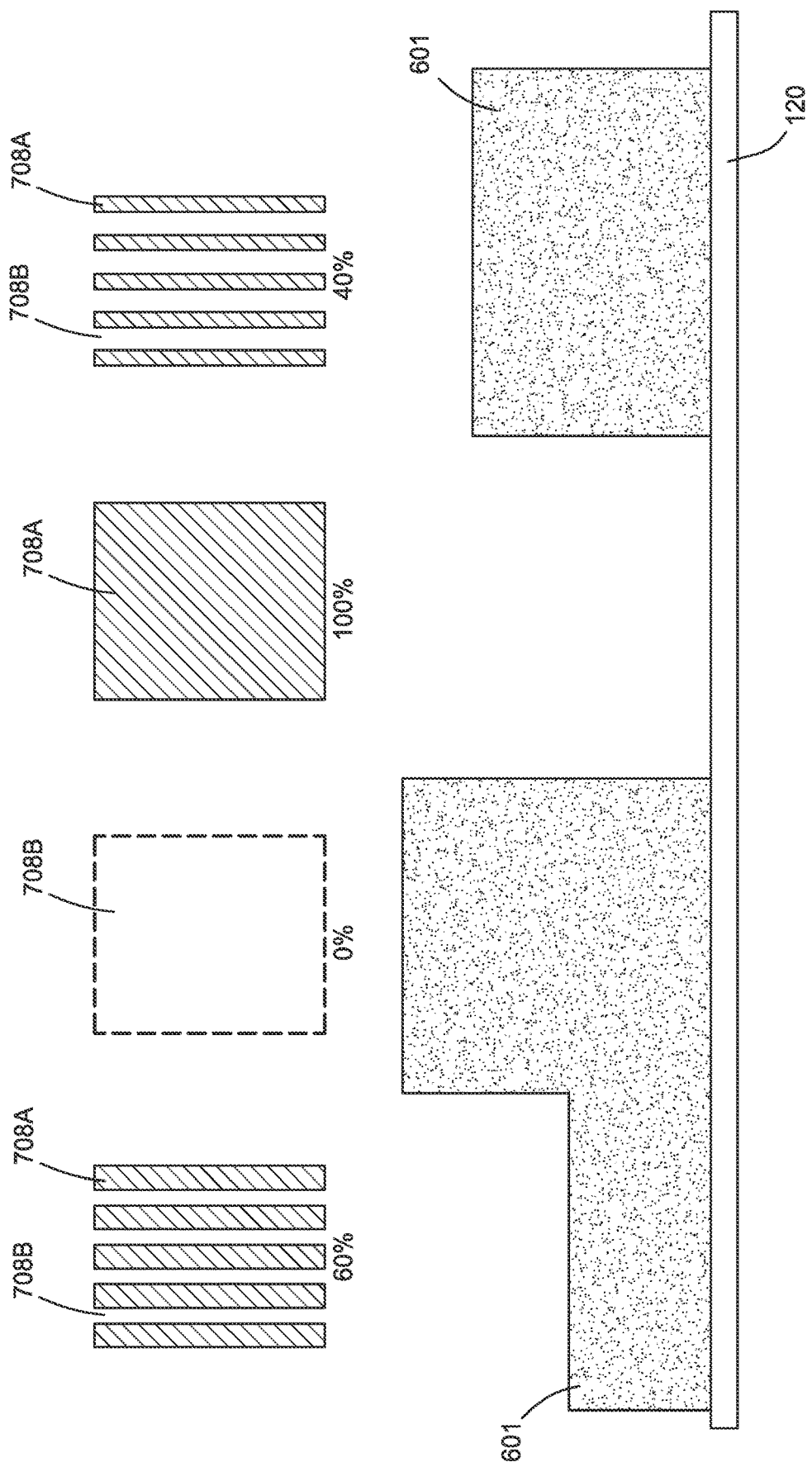
FIG. 10 is a schematic cross-sectional view of the formation of varying step heights in a photoresist profile, according to certain embodiments.

FIG. 10 is a schematic cross-sectional view of the formation of varying step heights in the profile of the photoresist layer 601, according to certain embodiments. The local transmittance rate of the plurality of shots 606 delivered to each of the sub-grids 702 of the gray pattern 700 may be varied from 0% to 100% across the exposure area 602. In an example shown in FIG. 10, varying the local shot transmittance rate causes formation of different step heights in the photoresist layer 601 (shown in FIG. 6) which can then be transferred into one or more underlying layers by an etch process (e.g., an anisotropic etch process) for incorporation in an integrated circuit, display, etc. In embodiments where the transmittance rate is 0% (i.e., the width of the pattern lines 708A in the pattern unit 704 is "0"), the respective sub-grid 702 therein would not receive any of the plurality of shots 606 and thus the thickness of the photoresist layer 601 remaining would be 100%. In embodiments where the transmittance rate is 100% (i.e., the width of the non-pattern lines 708B in the pattern unit 704 is "0" such that the pattern lines 708A occupy the entire area of the plurality of pattern units 704), the entire area of the respective sub-grid 702 would receive 100% of the plurality of shots 606 and thus the photoresist layer 601 would be completely removed. Therefore, varying the local transmittance rate of sub-grids 702 across the exposure area 602 by defining the pattern units 704 provides increased control in the light delivered to the photoresist layer 601 and the topography profile formed therein. In certain embodiments, the topography profile formed in the photoresist layer 601 can be curved, spherical, aspherical, concave, convex, tapered, half-cylindrical, or angled profile.

Figure 11:
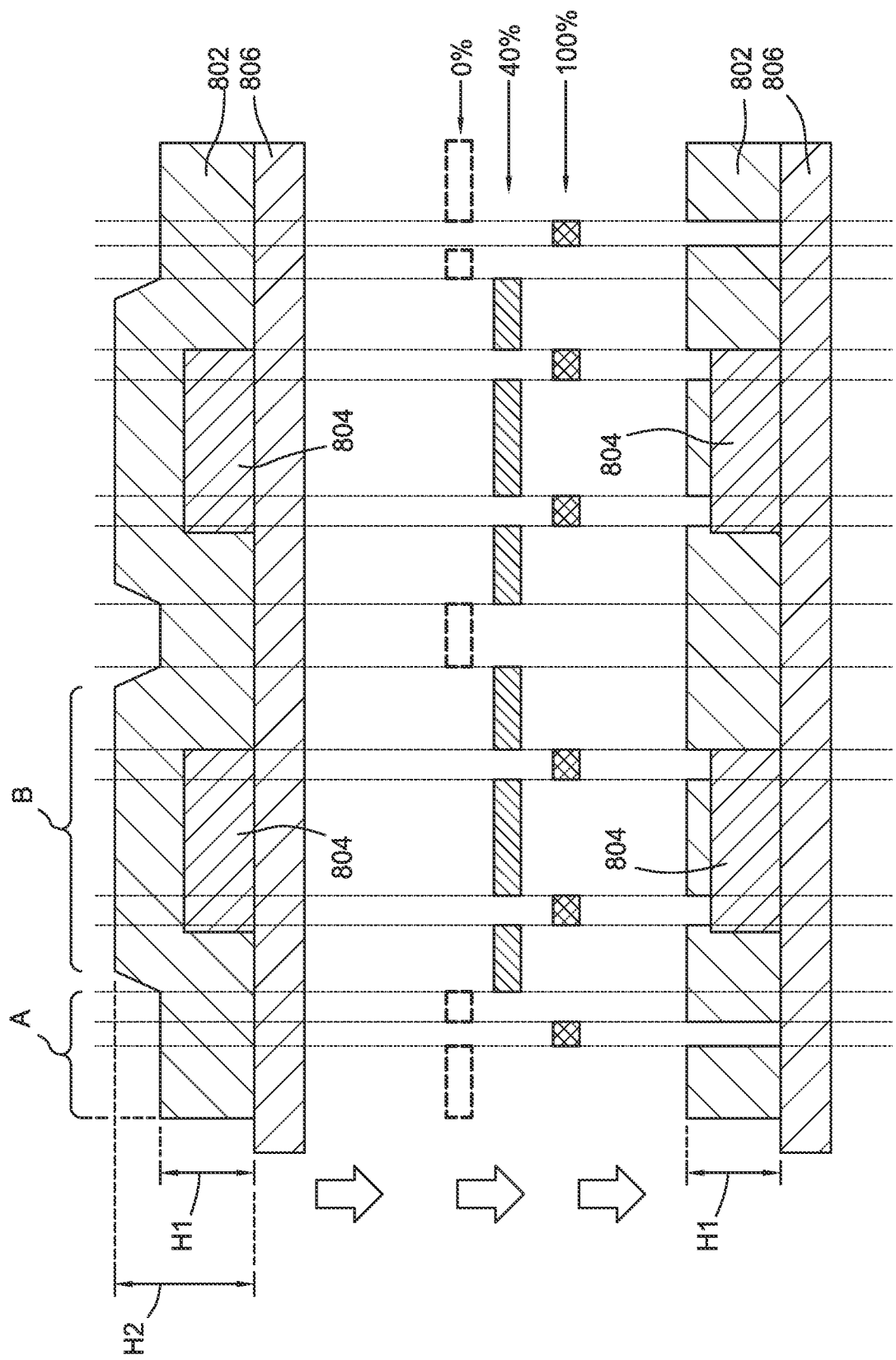
FIG. 11 is a schematic cross-sectional view of the planarizing of a photoresist topography profile, according to certain embodiments.

In addition to forming different step heights in the photoresist layer 601, varying the local transmittance rate of the write beams delivered to the sub-grids 702 can be utilized to flatten or planarize a top surface of the photoresist layer 601. FIG. 11 is a cross-sectional view of a film stack layer before and after exposure at varying local transmittance rates. In an embodiment, flattening the topography profile of the photoresist layer 601 can be useful for photoresist layers used to form planarization and/or passivation layers. Planarization of surface topography reduces surface roughness and electrical passivation in order to reduce capacitive coupling between formed components and underlying substrates and layers. Typically, subsequent etching of the resist and/or polishing is required to achieve planarization of the resist layer. However, use of the method described herein to also planarize the surface of the photoresist layer used to form a planarization layer may reduce the need for and possibly even avoid altogether, any subsequent processes (i.e. chemical mechanical polishing (CMP)) to prepare and flatten the surface of the resist layer.

FIG. 11 is a cross-sectional schematic view of a photoresist layer 802 disposed over a plurality of features 804 formed on a substrate 806. Portions "A" of the photoresist layer 802 disposed directly on the substrate 806 is formed with a height "H1" from the surface of the substrate 806. On the other hand, the topography of the plurality of features 804 causes respective portions "B" of the photoresist layer 802 to correspondingly be formed with an increased height "H2" from the surface of the substrate 806. In addition to removing portions of the photoresist layer 802 in accordance with the mask pattern data by using a local transmittance rate of 100% during exposure, the topography of the photoresist layer 802 can also be planarized without any additional processes by varying the local transmittance rate over portions A and B of the photoresist layer 802 to reduce the topography of portions "B" of the photoresist layer 802 from H2 to H1. In the example shown in FIG. 11, the exposure over portions A of the photoresist layer 802 is performed with a 0% local transmittance rate in order to maintain the H1 height and thickness of the photoresist layer 801. Whereas a 100% local transmittance rate is shown to completely remove the photoresist layer 801 in portions B and expose the surface of the features 804, a 40% local transmittance rate over portions B would only partially remove the photoresist layer and reduce the topography of the respective portions "B" of the photoresist layer 802 to H1. Accordingly, the disclosure described herein provides several benefits over conventional methods and systems.

Figure 12:
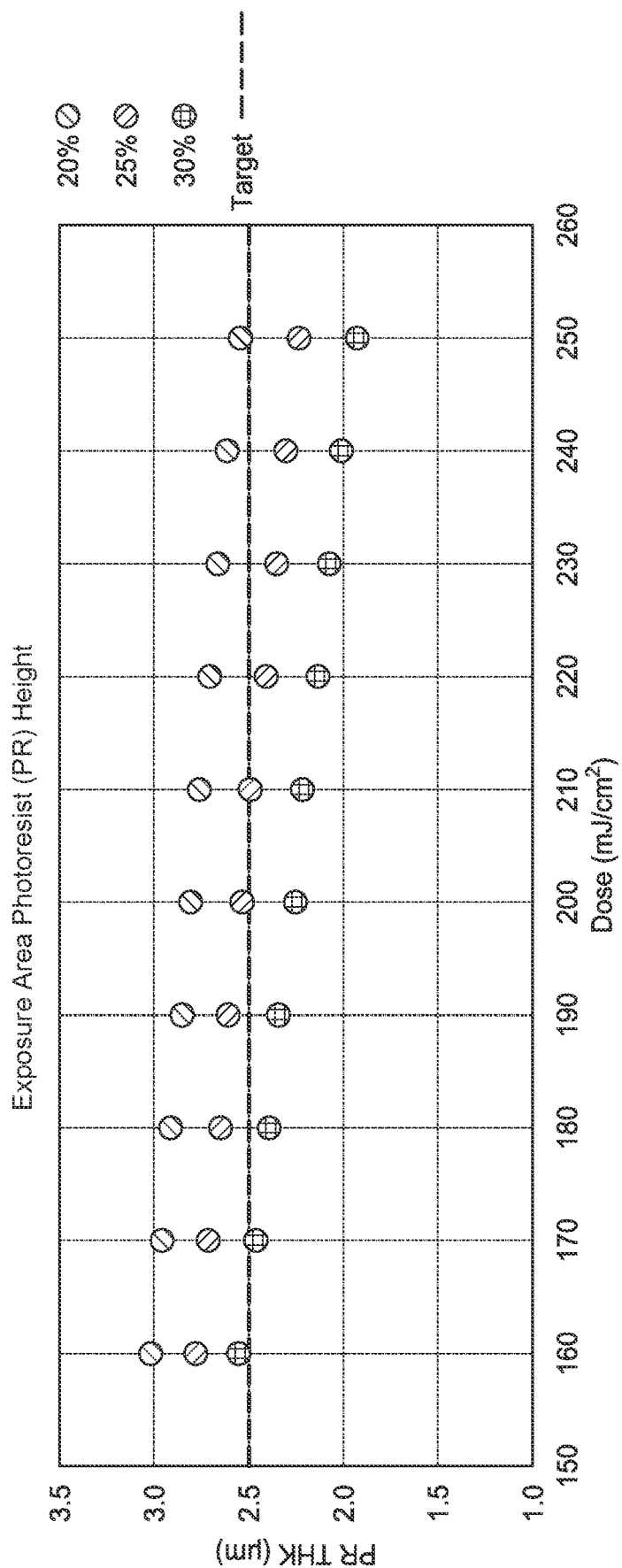
FIG. 12 is a graph of a remaining photoresist thickness of a gray pattern, according to certain embodiments.

FIG. 12 is a graph of remaining photoresist thickness of a gray pattern after exposure at varying transmittance rates and dose amounts. As shown, the remaining photoresist thickness depends on both the transmittance rate and dose amount of the write beam. The dose amount may be varied by changing a dwell time and/or intensity of the exposure relative to other dose amounts. In one embodiment, which can be combined with other embodiments described herein, the dose amount may be selected based on the photoresist material and the maximum photoresist thickness required to be removed according to the mask pattern data. The dose amount may accordingly be selected such that 100% transmittance at the designated dose amount is sufficient to remove the maximum photoresist thickness required to be removed. In certain embodiments, the maximum photoresist thickness to be removed may be equal to the entire photoresist thickness. Alternatively, the maximum photoresist thickness to be removed may be less than the original photoresist thickness.

Varying the local shot transmittance rate between portions of the photoresist layers 601 to form different step heights can in some instances cause irregularities in the pattern actually written in the photoresist layer 601 due to the optical or process proximity effect. Proximity effects are caused by the unavoidable scattering of electrons after the write beam from the image projection system 200 contacts the photoresist layer 601. The result is that edge placement integrity between sub-grids 702 of varying step height, or exposed and unexposed sub-grids 702, becomes blurred with the edge portions between the sub-grids 702 being somewhere in between. Such resulting unintended irregularities may impact or alter the electrical properties of the component being fabricated. In another embodiment, proximity effects may also be caused by process steps such as development and/or curing of the photoresist layer. Generally, optical proximity correction processes including subsequent exposure corrections, are required to correct these errors by moving edges or adding extra polygons to the pattern being written. However, by varying and using a different local transmittance rate at edge/boundary portions, such additional correction processes can be avoided with correction already accounted for.

Figure 13:
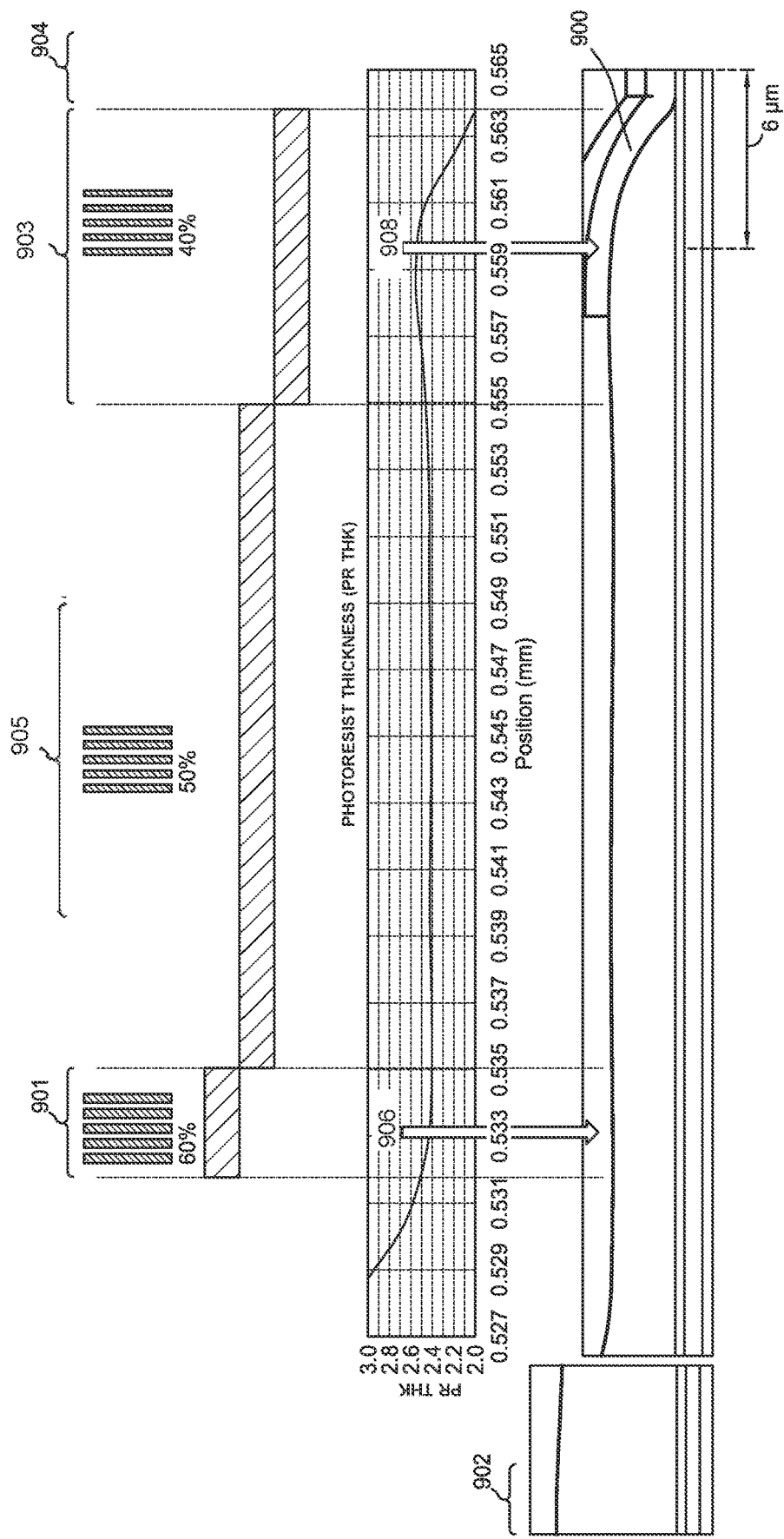
FIG. 13 is a cross-sectional view of an exposed photoresist profile, according to certain embodiments.

FIG. 13 is a cross-sectional view of an example of an exposed photoresist layer 900 formed and extending between a pad 902 and a via 904. In the example shown, the photoresist 900 has a remaining thickness ranging from 4.252 μm near the portion of the photoresist where the pad 902 is formed and where the local transmittance rate of received write beams is 0%, down to 0 μm near the via 904 and where the local transmittance rate was 100%. The region of the photoresist 900 disposed between the pad 902 and the via 904 is a relatively flat half-tone region 905 formed by exposure to write beams with a 50% local transmittance rate. As shown in FIG. 13, at a boundary region 901 of the photoresist 900 between the portion of the photoresist layer 900 disposed over the pad 902 and the half-tone region 905, a dent 906 is formed due to the optical proximity effect in the photoresist layer 900. Specifically, that in the example shown, the optical proximity effect causes the photoresist layer 900 at the dent 906 to be formed thinner (about 2.476 μm) than the half-tone region 905 (between about 2.481 μm and 2.523 μm) of the photoresist layer 900. At a boundary region 903 of the photoresist 900 where the portion of the photoresist layer 900 disposed over the half-tone region transitions to the portion near the via 904, a hump 908 is also formed in the topography of photoresist layer 900 due to the optical proximity effect. Specifically, that the hump portion 907 of the photoresist layer 900 is formed thicker (about 2.649 μm) than the half-tone region 905 (between about 2.481 μm and 2.523 μm) of the photoresist layer 900 before dropping down 0 μm at the via 904.

Figure 14A:
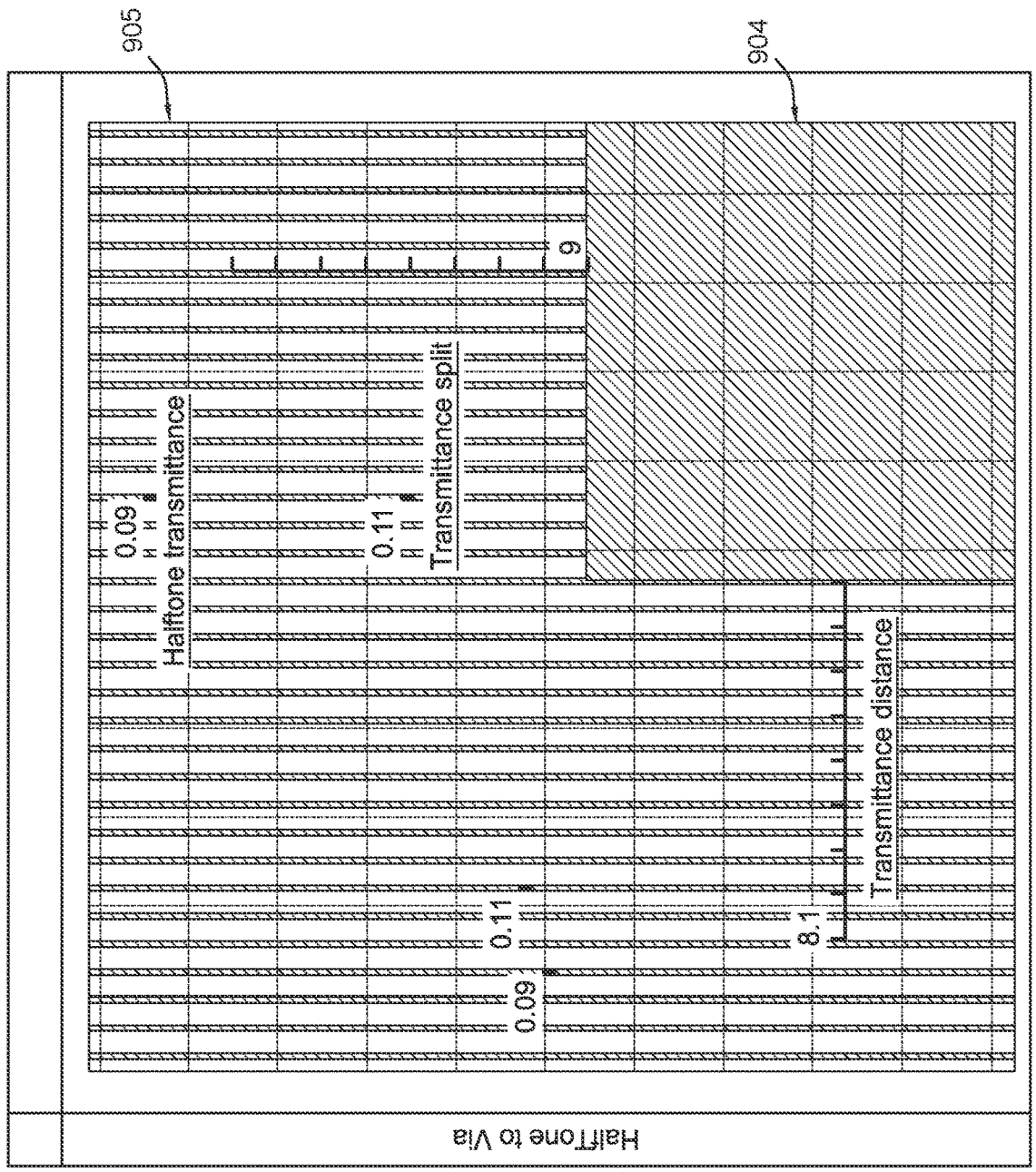
FIGS. 14A and 14B depict illustrations of rate maps of a portion of a gray pattern, according to certain embodiments.
Figure 14B:
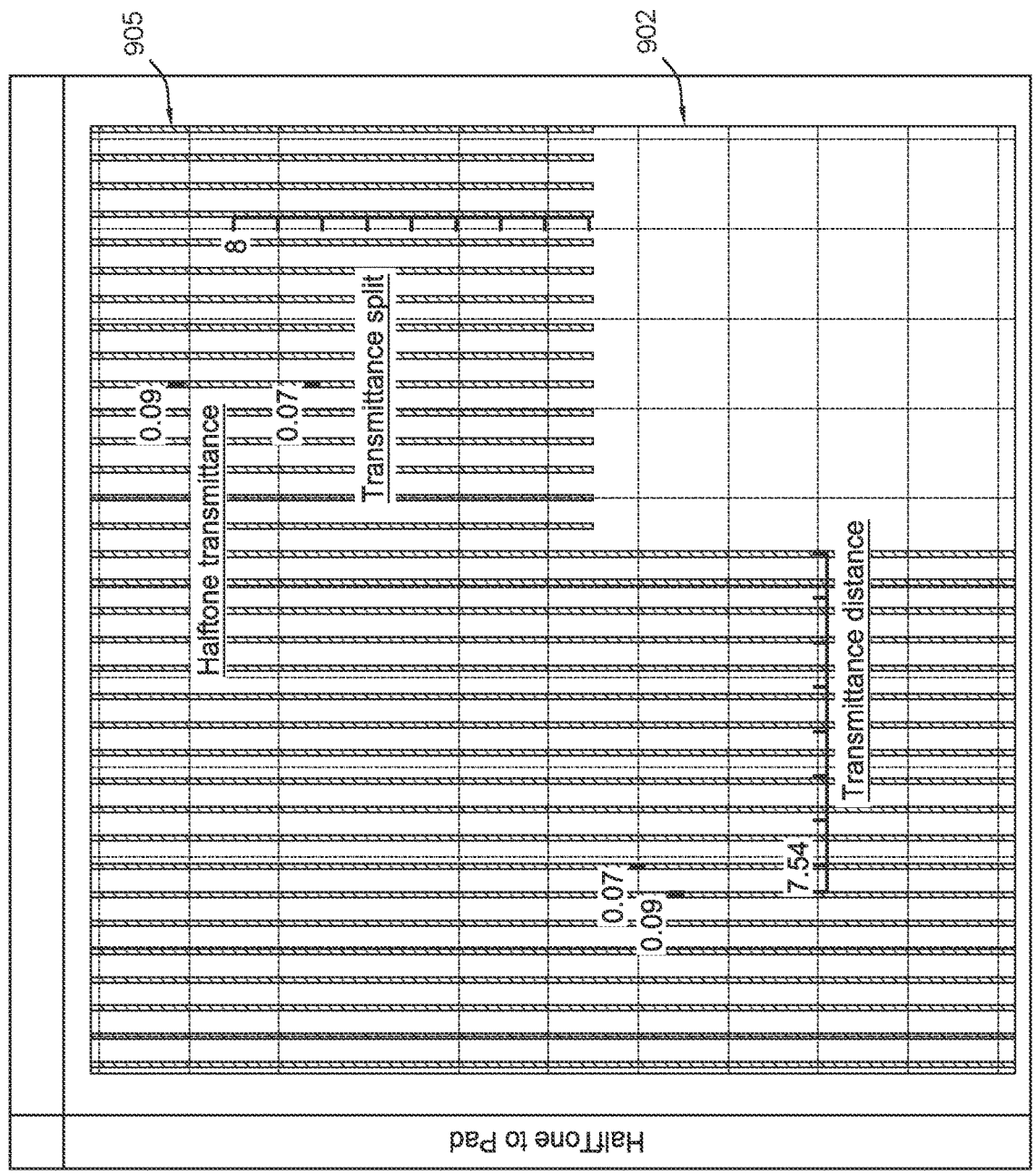

To avoid such irregularities, the local transmittance rate at such boundary regions can be varied, such as by decreasing the local transmittance rate at the boundary region 901 to 40% and increasing the local transmittance rate at the boundary region 903 to 60%. FIGS. 14A and 14B depict an example illustration of corresponding gray patterns formed for the boundary regions 901, 903 with varying transmittance rates utilized for the boundary regions. In FIG. 14A, a gray pattern between the half-tone region 905 and the via 904 is shown with the 0.09 width of the patterned lines 708 in the half-tone region 905 being increased to 0.11 in the transition region, thereby increasing transmission rates, as the position moves closer to the 100% transmission rate at the via 904. In FIG. 14B, a gray pattern between the half-tone region 905 and the pad 902 is shown with the 0.09 width of the patterned lines 708 in the half-tone region 905 is decreased to 0.07 in the transition region, thereby decreasing transmission rates, as the position moves closer to the 0% transmission rate at the pad 902. By varying and using a different transmittance rate at each of the respective boundary regions, the effects of the optical proximity effect can be controlled and minimized.

In some embodiments, the number of shots 606 projected in each sub-grid 702 of the gray pattern 700 will not always lead to a smooth thickness transition between adjacent sub-grids 702 of the photoresist layer 601. Therefore, a widening of the laser pulse of the light source 202 projected to the substrate 120 by increasing shot time or utilizing a higher printing scan speed may be performed to improve the transition of thickness in the photoresist layer 601. As the stage 114 (shown in FIG. 1) moves at a constant speed during a scan, widening the laser pulse (i.e., increasing the pulse width) will reduce the roughness of the photoresist layer 601 in the direction of movement of the stage 114. Conventionally, the pulse width of the light source 202 multiplied by the speed of the stage 114 is about 40% or less of a pixel pitch 215 (shown in FIG. 2B). However, in the first smoothing operation, the pulse width of the light source 202 multiplied by the speed of the stage 114 is about 100% to about 150% of the pixel pitch 215 to allow for blending of the plurality of shots 606 that have been projected. The blending occurs in the direction of movement of the stage 114.

The transmittance control method described herein allows the photoresist profile to be formed in a single exposure operation of the image projection system 200. Executing the exposure operation in a single pass can reduce the occurrence of multiple exposures. The single exposure operation leads to increases in throughput and reduces alignment issues. Further, regardless of the queue time (the time between the exposure and development of the photoresist layer 601), the profile will be formed due to only requiring a single exposure. Thus, the gray pattern 700 allows for improved throughput, ability to flatten as well as develop different step heights in the profiles of the photoresist layer 601, control and minimize the irregularities caused by optical proximity effect, reduces overlay issues associate with the usage of multiple masks.

Figure 15:
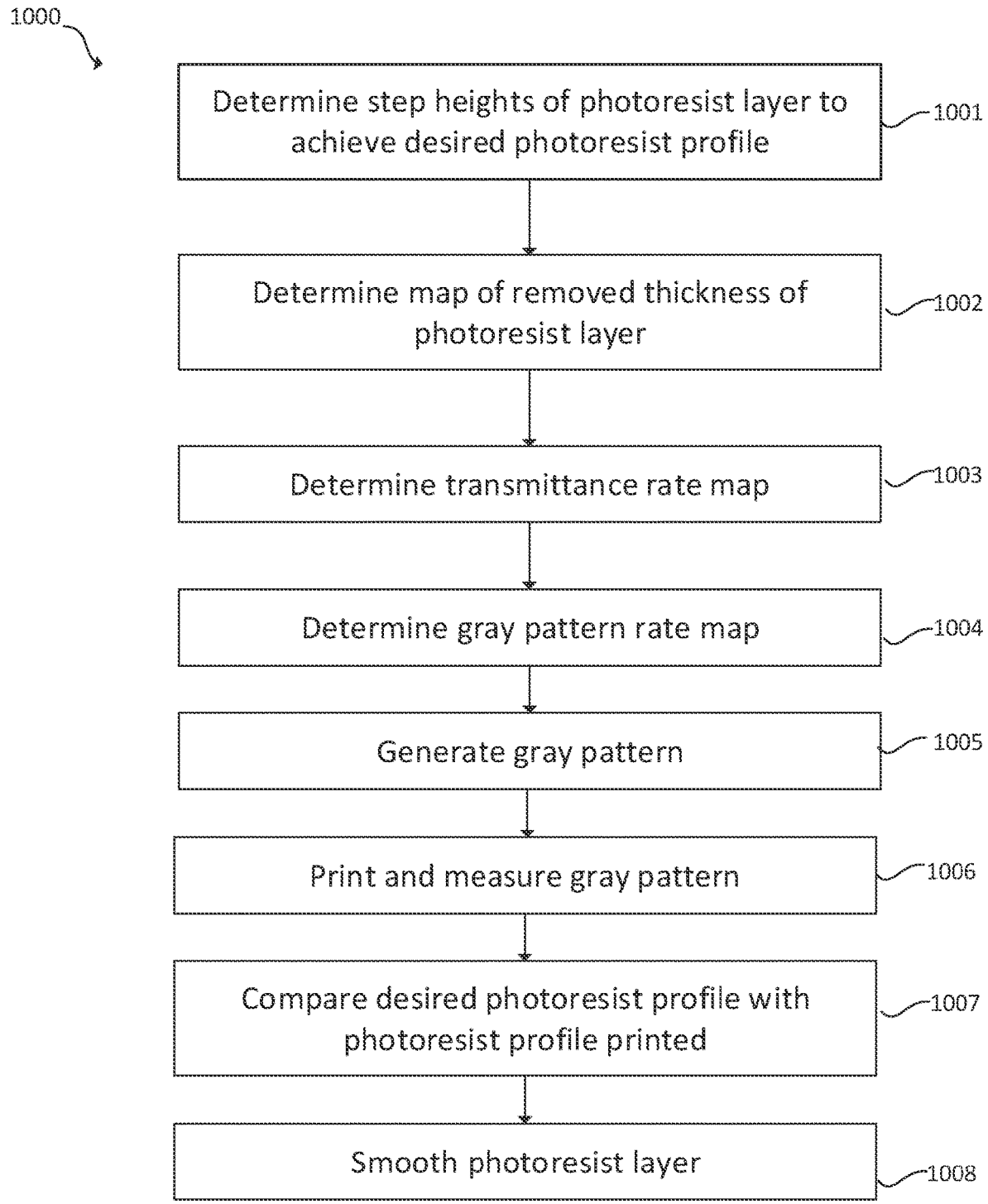
FIG. 15 is a flow diagram of an example method for forming a desired profile in a photoresist layer with a lithography process, according to certain embodiments.

FIG. 15 is a flow diagram of a method 1000 for generating a desired profile in a photoresist layer 601 by controlling transmittance rates in a lithography process. The method 1000 allows for defining the gray pattern 700 according to the desired photoresist profile. A controller 122 as described herein facilitates the operations of the method 1000. The method 1000 is performed in a single exposure operation of the image projection system 200. Prior to the method 1000, a desired photoresist profile is determined. The method 1000 may be at least partially executed by the single exposure lithography application 312.

At operation 1001, step heights of a photoresist layer are determined to achieve a desired photoresist profile. The step heights are utilized to determine a necessary local transmittance rate at a designated dose to remove a certain thicknesses of a photoresist layer and modify the photoresist profile. The local transmittance rate and designated dose necessary to obtain the step heights of the desired photoresist profile may be empirically determined beforehand, and applicable for future operations. At operation 1002, a map of the photoresist thickness to be removed across the photoresist layer is determined to achieve the desired photoresist profile. The map depicts the removed thickness of the photoresist at each position. The designated dose utilized may be determined based on the resist type and maximum resist thickness needed to be removed. The map of the removed thickness is determined based on the contrast curve.

At operation 1003, a transmittance rate map is determined. The transmittance rate map is determined by referencing the map of the removed thickness against the contract curve. The transmittance rate corresponds to a percentage of the photoresist layer 601 that is developed from exposing the photoresist to the intensity of light emitted from a light source 202 of the image projection system 200 at the designated dose. For example, by determining the removed thickness at each location, the necessary transmittance rate for the designated dose can be determined at each location.

At operation 1004, a gray pattern rate map is determined. The gray pattern rate map is derived by determining a ratio of the local transmittance rate at each location (i.e., at each sub-grid 702) to a nominal transmittance rate. The gray pattern rate map determines the number of shots 606 to be projected per sub-grid 702 based on the transmittance rate map. The gray pattern rate map determines a local transmittance rate at each sub-grid 702. At operation 1005, a gray pattern 700 is generated based on the gray pattern rate map. The gray pattern rate map dictates the ratio of the local transmittance rate to the nominal transmittance rate. A plurality of pattern units 704 in each sub-grid 702 define the gray pattern 700. The pattern areas 704 for each sub-grid 702 are determined at operation 1005 to correspond with the gray pattern density map. The gray pattern 700 is provided to the image projection system 200 by the controller 122 in the form of mask pattern data.

At operation 1006, the gray pattern is printed and measured. When the substrate 120 scans under the image projection system 200 in a single pass the processing unit 106 projects a plurality of shots 606 according to the gray pattern 700. The local transmittance rate is varied across the plurality of sub-grids 702. As the transmittance rate at each sub-grid 702 depends on the local transmittance rate, the thickness of photoresist layer 601 removed will vary across the substrate 120. Therefore, the profile of the photoresist layer 601 will have varying step heights. The thickness of the may then be measured. At operation 1007, the thickness of the desired photoresist profile is compared with the thickness of the profile formed in the photoresist layer 601 at the operation 1006. In embodiments where the thicknesses do not match, the rate map is adjusted accordingly. For example, the transmittance rate at each location can be increased or decreased. As a result, the pattern lines 708 in respective pattern units 704 will increase or decrease in area responsively. Operations 1003-1007 may then be repeated until the thickness of the profile formed is equal with the thickness of the desired photoresist profile.

At operation 1008, the photoresist layer 601 is smoothed. In some embodiments, the number of shots 606 projected in each sub-grid 702 of the gray pattern 700 will not always lead to a smooth thickness transition between adjacent sub-grids 702 of the photoresist layer 601. Therefore, one of a first smoothing operation and second smoothing operation may be performed to improve the transition of thickness in the photoresist layer 601.

The first smoothing operation includes tuning the image projection system 200 to print the gray pattern 700 slightly out of focus. Therefore, the plurality of shots 606 projected in the exposure area 602 will be blurred. The plurality of shots 606 being blurred will increase the blending of the adjacent shots 606. Therefore, when the photoresist layer 601 is developed, the thickness transitions will be smoother.

The second smoothing operation includes a baking process. The baking process may be performed on photoresist layer 601 after exposure (i.e., the operation 1006). The baking process may be performed on an underlying film layer after development of the photoresist layer 601. The baking temperature is about 150° C. to about 250° C. The baking has a diffusion effect, which allows the photoresist or the underlying film layer to slightly melt. Thus, the photoresist or the underlying film will be smoothed.

In summation, a system, a software application, and a method of a lithography process to control write beam transmission rates and form a desired profile of a photoresist layer in a single exposure operation is provided herein. To form the desired profile in the photoresist layer, a local transmission rate of a plurality of shots within an exposure area is varied. A plurality of pattern units corresponding to portions of the exposure area to receive the plurality of shots is used to determine the local transmission rate provided by an image projection system at each sub-grid of the exposure area. The local transmission rate will determine the thickness of a photoresist layer when the plurality of shots are projected to the photoresist layer. By adjusting the local transmission rate by defining the plurality of pattern units and where the plurality of shots are to be projected within each sub-grid of the exposure area, the thickness of the photoresist layer can be formed with the desired profile and/or a top surface of the photoresist layer can be planarized. The desired profile and the flattening of the top surface of the photoresist layer may be formed in a single exposure operation of the lithography system. Utilizing the gray pattern allows for improved throughput, ability to planarize as well as develop different step heights in the desired profiles of the photoresist layer, control and minimize the irregularities caused by the optical proximity effect, and reduces overlay issues associate with the usage of multiple masks.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
providing a mask pattern data having a plurality of exposure areas to a processing unit of a lithography system, the processing unit having an image projection system that receives the mask pattern data, wherein each exposure area includes a gray pattern, the gray pattern comprising:
a plurality of sub-grids; and
a plurality of pattern units in each sub-grid, wherein each of the plurality of pattern units include a plurality of patterned lines, and wherein the plurality of patterned lines in the plurality of pattern units of each sub-grid correspond to a local transmittance rate of a plurality of shots to be received in each sub-grid; and
in a single scan of a substrate having a photoresist layer disposed thereon under the image projection system:
projecting a plurality of shots to the plurality of patterned lines in each of the plurality of pattern units of the gray pattern to the photoresist layer; and
developing the photoresist layer to form a desired profile in the photoresist layer, the desired profile defined by the local transmittance rate at each sub-grid of each exposure area.

2. The method of claim 1, further comprising selecting a designated dose for the plurality of shots, wherein the designated dose amount is determined based on a photoresist type and a maximum photoresist thickness needed to be removed.

3. The method of claim 1, further comprising varying the local transmittance rate at sub-grids positioned on boundary regions between sub-grids of the plurality of exposure areas having different local transmittance rates to control and minimize irregularities in the photoresist layer caused by a proximity effect.

4. The method of claim 1, wherein the local transmittance rate corresponds to a ratio of a width of the plurality of patterned lines to a width of the patterned unit in each sub-grid, respectively.

5. The method of claim 1, further comprising varying the local transmittance rate at sub-grids of each of the plurality of exposure areas to planarize a topography of the photoresist layer.

6. The method of claim 1, wherein the image projection system comprises a spatial light modulator with a plurality of mirrors to project the plurality of shots to each of the plurality of exposure areas.

7. The method of claim 1, wherein the plurality of pattern units of the gray pattern are derived based on the local transmittance rate desired at each sub-grid.

8. The method of claim 1, further comprising widening a pulse width of a light source in the image projection system to improve a transition thickness between adjacent sub-grids of each of the plurality of exposure areas in the photoresist layer.

9. The method of claim 1, wherein the plurality of patterned lines in each of the plurality of patterned units are formed with 2 pitch vertical or angled patterned lines, 2.5 pitch vertical or angled patterned lines, or 3 pitch vertical or angled patterned lines.

10. The method of claim 1, wherein increasing the local transmittance rate at each sub-grid in each of the plurality of exposure areas increases a thickness of the photoresist layer to be removed during development.

11. The method of claim 1, wherein decreasing the local transmittance rate at each sub-grid in each of the plurality of exposure areas decreases a thickness of the photoresist layer to be removed during development.

12. A system, comprising:
a slab;
a moveable stage disposable over the slab, the moveable stage configured to support a substrate having a photoresist layer disposed thereon;
a controller configured to provide a mask pattern data to a lithography system, the mask pattern data having an exposure area with a gray pattern, wherein the gray pattern is defined by a plurality of sub-grids, each sub-grid including a plurality of pattern units defined therein; and
a lithography system support coupled to the slab having an opening to allow the moveable stage to pass thereunder, wherein:
the lithography system has a processing unit with an image projection system that receive the mask pattern data;
the image projection system comprising a spatial light modulator with a plurality of spatial light modulator pixels to project a plurality of shots;
the controller is configured to dispose a plurality of patterned lines in each of the plurality of pattern units within each of the sub-grids to vary a local transmittance rate at each sub-grid; and
the controller is configured to instruct each of the spatial light modulators to project the plurality of shots to the plurality of patterned lines in each of the plurality of pattern units in each sub-grid of the gray pattern.

13. The system of claim 12, wherein the local transmittance rate in each sub-grid corresponds to a ratio of a width of the plurality of patterned lines to a width of the respective patterned unit in each sub-grid.

14. The system of claim 13, wherein the controller is configured to increase the local transmittance rate to increase a thickness of the photoresist layer to be removed during development.

15. The system of claim 13, wherein the controller is configured to decrease the local transmittance rate to decrease a thickness of the photoresist layer to be removed during development.

16. The system of claim 12, wherein the plurality of shots exposes the photoresist layer to an intensity of light emitted from the plurality of image projection systems to form varying step heights in the photoresist layer.

17. The system of claim 12, wherein the controller is configured to vary the local transmittance rate at sub-grids positioned on boundary regions between sub-grids of the plurality of exposure areas having different local transmittance rates to control and minimize irregularities in the photoresist layer caused by the optical proximity effect.

18. The system of claim 12, wherein the plurality of patterned units in each sub-grid are disposed with 2 pitch vertical or angled patterned lines, 2.5 pitch vertical or angled patterned lines, or 3 pitch vertical or angled patterned lines to vary the local transmittance rate at each sub-grid.

19. The system of claim 12, wherein each spatial light modulator pixel of the plurality of spatial light modulator pixels of the spatial light modulator is individually controllable by the controller.

20. A layered film device comprising:
a substrate and a patterned photoresist layer disposed on the substrate, the patterned photoresist having a predetermined profile formed from a photoresist layer in a single exposure operation by a lithography system by performing the operations of:
providing a mask pattern data having a plurality of exposure areas to a processing unit of the lithography system, the mask pattern data corresponding to the desired profile of the patterned photoresist, the processing unit having an image projection system that receives the mask pattern data, wherein each exposure area includes a gray pattern, the gray pattern including a plurality of sub-grids with each sub-grid having a plurality of pattern units, wherein each of the plurality of pattern units includes a plurality of patterned lines, the plurality of patterned lines in each of the plurality of sub-grids corresponding to a local transmittance rate of a plurality of shots to each sub-grid;
projecting the plurality of shots at a designated dose to the plurality of patterned lines in each of the plurality of pattern units of the gray pattern; and
developing the photoresist layer to form the predetermined profile in the photoresist layer, the predetermined profile defined by the local transmittance rate of the plurality of shots at the designated dose received in each sub-grid of each exposure area.

* * * * *